(12) United States Patent
Garg et al.

(10) Patent No.: US 12,456,981 B2
(45) Date of Patent: Oct. 28, 2025

(54) NON-BINARY COMPUTER USING ALTERNATING CURRENT

(71) Applicant: 6GCO Ltd., London (GB)

(72) Inventors: Gagan Garg, Pune (IN); Anindya Bose, West Bengal (IN)

(73) Assignee: 6GCO Ltd, London (GB)

( * ) Notice: Subject to any disclaimer, the term of this patent is extended or adjusted under 35 U.S.C. 154(b) by 17 days.

(21) Appl. No.: 18/635,889

(22) Filed: Apr. 15, 2024

(65) Prior Publication Data

US 2024/0267047 A1     Aug. 8, 2024

Related U.S. Application Data

(63) Continuation of application No. PCT/IB2022/059875, filed on Oct. 14, 2022.

(60) Provisional application No. 63/256,473, filed on Oct. 15, 2021.

(51) Int. Cl.
*H03K 17/687* (2006.01)
*H03K 19/094* (2006.01)
*H03K 19/20* (2006.01)

(52) U.S. Cl.
CPC ..... *H03K 19/09425* (2013.01); *H03K 17/687* (2013.01); *H03K 19/20* (2013.01)

(58) Field of Classification Search
CPC . H03K 17/687; H03K 19/09425; H03K 19/20
USPC .......................................................... 327/564
See application file for complete search history.

(56) References Cited

U.S. PATENT DOCUMENTS 4,853,753 A * 8/1989 Capasso .................. G11C 11/38
326/134

OTHER PUBLICATIONS

International Search Report and Written Opinion for International Application No. PCT/IB2022/059875 mailed Jan. 27, 2023 (10 pages).
Sheng Lin, et al. "CNTFET-Based Design of Ternary Logic Gates and Arithmetic Circuits", IEEE Transactions on Nanotechnology, vol. 10, No. 2, Mar. 2011 (9 pages).
Zarin Tasnim Shandhie, et al. "Design of Ternary Logic and Arithmetic Circuits Using GNRFET", IEEE Open Journal of Nanotechnology, Sep. 1, 2020 (11 pages).

* cited by examiner

*Primary Examiner* — William Hernandez
(74) *Attorney, Agent, or Firm* — Crowell & Moring LLP

(57) ABSTRACT

An integrated circuit for a computer may include a non-binary logic gate circuit configured to perform a logic operation that includes: at least one input terminal; an output terminal; and transistor circuitry configured to: receive, via the at least one input terminal, at least one alternating current (AC) input voltage at three input voltage levels, wherein each of the three input voltage levels corresponds to a respective one of three logic values; and generate, at the output terminal, an output voltage at one or more output voltage levels based on the at least one AC input voltage and the logic operation, wherein each of the one or more output voltage levels corresponds to a respective one of the three logic values.

7 Claims, 32 Drawing Sheets

FIG. 9A

| No. | Diagram Description | Venn Diagram | No. | Diagram Description | Venn Diagram | No. | Diagram Description | Venn Diagram | No. | Diagram Description | Venn Diagram |
|---|---|---|---|---|---|---|---|---|---|---|---|
| 1 | Ø A B C AB BC BC ABC | 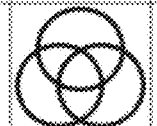 | 11 | Ø AB AC BC ABC |  | 21 | Ø AB AC ABC | 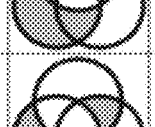 | 31 | Ø AB ABC |  |
| 2 | Ø A B AB AC BC ABC | 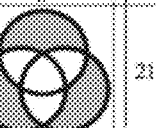 | 12 | Ø A AB AC ABC |  | 22 | Ø AB AC BC | 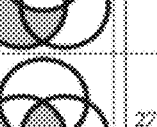 | 32 | Ø AB AC |  |
| 3 | Ø A B C AB AC ABC | 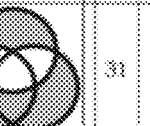 | 13 | Ø A AB BC ABC | 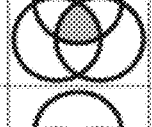 | 23 | Ø A BC ABC |  | 33 | Ø A ABC |  |
| 4 | Ø A B C AB AC BC |  | 14 | Ø A AB AC BC | 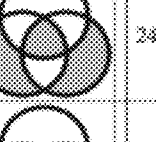 | 24 | Ø A AB ABC |  | 34 | Ø A BC | 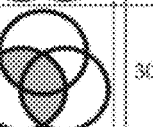 |
| 5 | Ø A AB AC BC ABC | 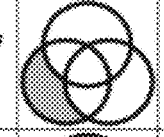 | 15 | Ø AB AB ABC |  | 25 | Ø A AB BC | 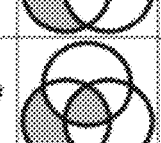 | 35 | Ø A AB |  |
| 6 | Ø A B AB AC ABC | 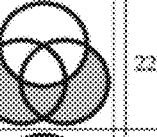 | 16 | Ø AB AC ABC |  | 26 | Ø A AB AC | 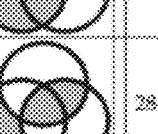 | 36 | Ø AB |  |
| 7 | Ø A B AC BC ABC | 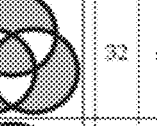 | 17 | Ø A B AB AC | 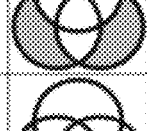 | 27 | Ø AB ABC |  | 37 | Ø ABC |  |
| 8 | Ø A B AB AC BC |  | 18 | Ø AB AC BC | 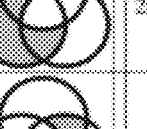 | 28 | Ø A B AC |  | 38 | Ø AB |  |
| 9 | Ø ABC AB ABC | 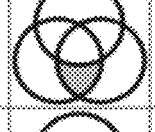 | 19 | Ø A B C ABC | 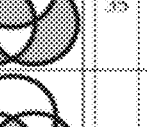 | 29 | Ø A B AB | 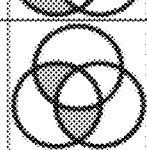 | 39 | Ø A |  |
| 10 | Ø ABC AB AC | 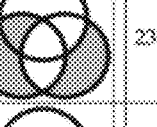 | 20 | Ø AB C AB |  | 30 | Ø A BC | 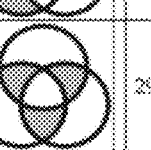 | 40 | Ø |  |

|  | 32 bit equivalent | | | | | | | | |
|---|---|---|---|---|---|---|---|---|---|
|  | Kb | Mb | Gb | | | | | | |
| Binary (bit) | 4294967296 | 4294967 | 4295 | 4.29 | | | | | |
| Trinary (trit) | 1.85302E+15 | 1.85302E+12 | 1853020189 | 1,853,020 | | | 431,440 | Times | |
|  | 64 bit equivalent | | | | | | | | |
|  | Kb | Mb | Gb | Tb | | Pb | | | |
| Binary (bit) | 1.84467E+19 | 1.84467E+16 | 1.8447E+13 | 18446744074 | 18446744 | 18446.74407 | | | |
| Trinary (trit) | 3.43368E+30 | 3.43368E+27 | 3.4337E+24 | 3,433,683,820,292,510,000,000 | 3,433,683,820,292,510,000 | 3,433,683,820,292,510 | 186,140,372,879 | Times | |

| base \ ^n | 1 | 2 | 3 | 4 | 5 | 6 | 7 | 8 | 9 | 10 |
|---|---|---|---|---|---|---|---|---|---|---|
| 2 | 2 | 4 | 8 | 16 | 32 | 64 | 128 | 256 | 512 | 1024 |
| 3 | 3 | 9 | 27 | 81 | 243 | 729 | 2187 | 6561 | 19683 | 59049 |

FIG. 12B

| Counting Decimal | 2 Bit Binary | 2nd Bit Carry | 1st Bit Sum | 2 Trit Trinary | 2nd Trit Carry | 1st Trit Sum |
|---|---|---|---|---|---|---|
| 0 | 0 (1 bit) | 0 | 0 | 0 (1 trit) | 0 | 0 |
| 1 | 1 (1 bit) | 0 | 1 | 1 (1 trit) | 0 | 1 |
| 2 | 10 (2 bit) | 1 | 0 | 2 (1 trit) | 1 | 0 |
| 3 | 11 (2 bit) | 1 | 1 | 10 (2 trits) | 1 | 1 |
| 4 | 100 (3 bit) | 0 | 0 | 11 (2 trits) | 1 | 1 |
| 5 | 101 (3 bit) | 0 | 1 | 12 (2 trits) | 1 | 2 |
| 6 | 110 (3 bit) | 1 | 0 | 20 (2 trits) | 2 | 0 |
| 7 | 111 (3 bit) | 1 | 1 | 21 (2 trits) | 2 | 1 |
| 8 | 1000 (4 bit) | 0 | 0 | 22 (2 trits) | 2 | 2 |

FIG. 14

Half Adder, 2 Inputs and 1 Bit/Trit

| Binary | | | | Decimal equivalent | |
|---|---|---|---|---|---|
| | | | | | |
| Inputs | | Output | | | |
| A | B | Carry (C) | Sum (S) | | Binary |
| 0 | 0 | 0 | 0 | 0 | 00 |
| 0 | 1 | 0 | 1 | 1 | 01 |
| 1 | 0 | 0 | 1 | 1 | 01 |
| 1 | 1 | 1 | 0 | 2 | 10 |

| Trinary | | | | Decimal equivalent | |
|---|---|---|---|---|---|
| | | | | | |
| Inputs | | Output | | | Trinary |
| A | B | Carry ( C ) | Sum ( S ) | | |
| 0 | 0 | 0 | 0 | 0 | 00 |
| 0 | 1 | 0 | 1 | 1 | 01 |
| 0 | 2 | 0 | 2 | 2 | 02 |
| 1 | 0 | 0 | 1 | 1 | 01 |
| 1 | 1 | 0 | 2 | 2 | 02 |
| 1 | 2 | 1 | 0 | 3 | 10 |
| 2 | 0 | 0 | 2 | 2 | 02 |
| 2 | 1 | 1 | 0 | 3 | 10 |
| 2 | 2 | 1 | 1 | 4 | 11 |

Simple Adder

CLA

LCU

|       | 1 Bit |
|-------|-------|
| Black | 0 |
| White | 1 |
| 2^1=2 | END |

|   | Intermediate | Binary | Trinary |
|---|--------------|--------|---------|
| 1 | Red | 100 | 01 |
| 2 | Green | 010 | 02 |
| 3 | Blue | 001 | 10 |
| 4 | White | 111 | 22 |
| 5 | Cyan | 011 | 11 |
| 6 | Magenta | 101 | 21 |
| 7 | Yellow | 110 | 12 |
| 8 | Black | 000 | 00 |
| 9 | NA | NA | NA 20 |
|   | 2^3=8, 3^2=9 | | END |

|  | Binary | Trinary |
|---|---|---|
| Blue | 0,0,255 | 0,0,6560 |
| Red | 255,0,0 | 6560,0,0 |
| Green | 0,255,0 | 0,6560,0 |
| Black | 0,0,0 | 0,0,0 |
| White | 255,255,255 | 6560,6560,6560 |

255 is the max integer representing an 8 bit number binary representation ($2^8$)
($3^8$) can represent 0 to 6560 i.e. 6561 x 6561 x 6561 in RGB channels

US 12,456,981 B2

NON-BINARY COMPUTER USING ALTERNATING CURRENT

CROSS-REFERENCE TO RELATED APPLICATIONS

This application is a continuation of International Application No. PCT/IB2022/059875, filed Oct. 14, 2022, which claims the benefit of priority to U.S. Provisional Application No. 63/256,473, filed Oct. 15, 2021. The contents of U.S. Provisional Application No. 63/256,473 are herein incorporated by reference in their entirety.

TECHNICAL FIELD

This disclosure generally relates to computer and computing architecture, and in particular relates to trinary computers that may use alternating current and may rely on non-binary, which may include three or more 'trits'.

BACKGROUND

Current computers use direct current ("DC") and an "on/off" state of architecture, known as binary computing and represented by 0s and 1s, and combinations thereof, as shown in FIG. 1. Demand for increased processing capability and speeds has driven the miniaturization of microprocessors and computer chips. However, computers using binary architecture are reaching the physical thresholds of miniaturization and the advancement of computers is slowing. Miniaturization of computer chips from 20 nm to 7 nm and now 5 nm, has resulted in evidence of quantum leakage of atoms and damage to the physical structure of silicon, as shown in FIG. 2. This has, in part, driven the development of quantum computers. However, quantum computers have their own constraints and do not, at the moment, represent a solution for increasing computing power for broader society; quantum computing requires operating temperatures of −273° ° C. or Absolute Zero (colder than outer space) in order to stabilize the 'quantum bits' to provide error free computing. Current DC binary computers, and the drive toward miniaturization, is also resulting in increased energy use especially in relation to cloud computing and data centers.

BRIEF DESCRIPTION OF THE DRAWINGS

The accompanying drawings, which are incorporated in and constitute a part of this specification illustrate various aspects of the present disclosure and together with the description, serve to explain its principles.

FIG. 9A shows diagrams of logic gates and truth tables.

FIG. 11B shows another diagram of functions at the trit level.

FIG. 12A shows a chart illustrating increase in computing power for 8 Bit, 8 Trit, 9 Trit, and 16 Trit.

FIG. 12B shows charts illustrating increase in computing power for 32 and 64 bit and trit equivalents.

FIG. 14 shows a chart illustrating counting with bits and trits.

DETAILED DESCRIPTION OF EMBODIMENTS

Figure 1:
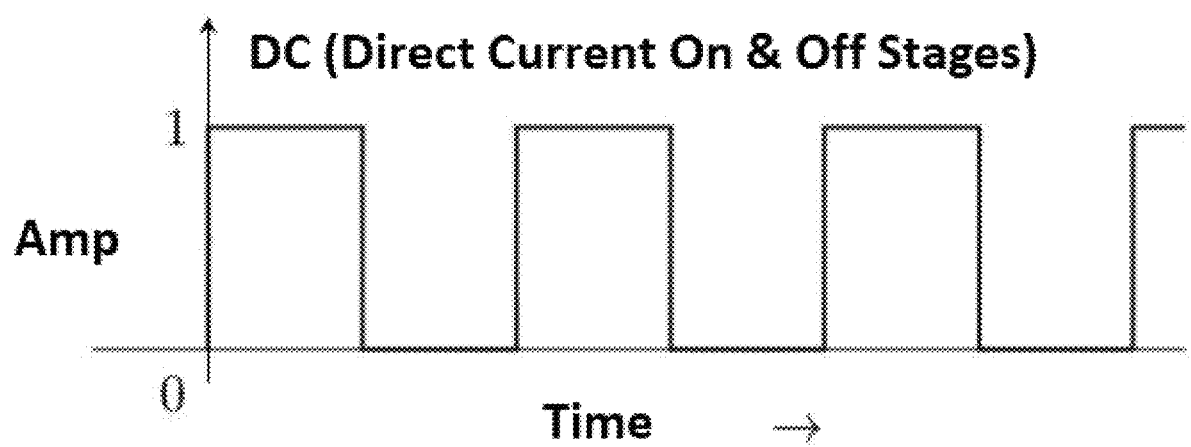
FIG. 1 shows a waveform of 0s and 1s for binary computing.
Figure 2:
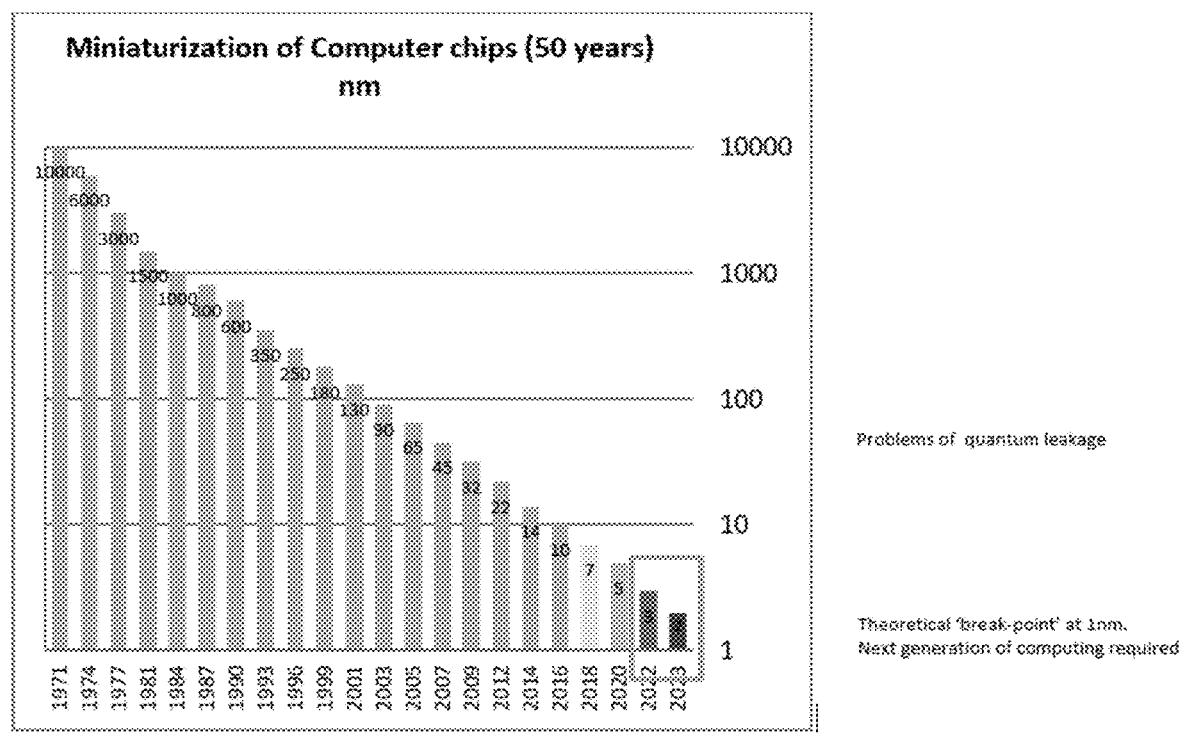
FIG. 2 shows a chart showing miniaturization of computer chips over 50 years.
Figure 3:
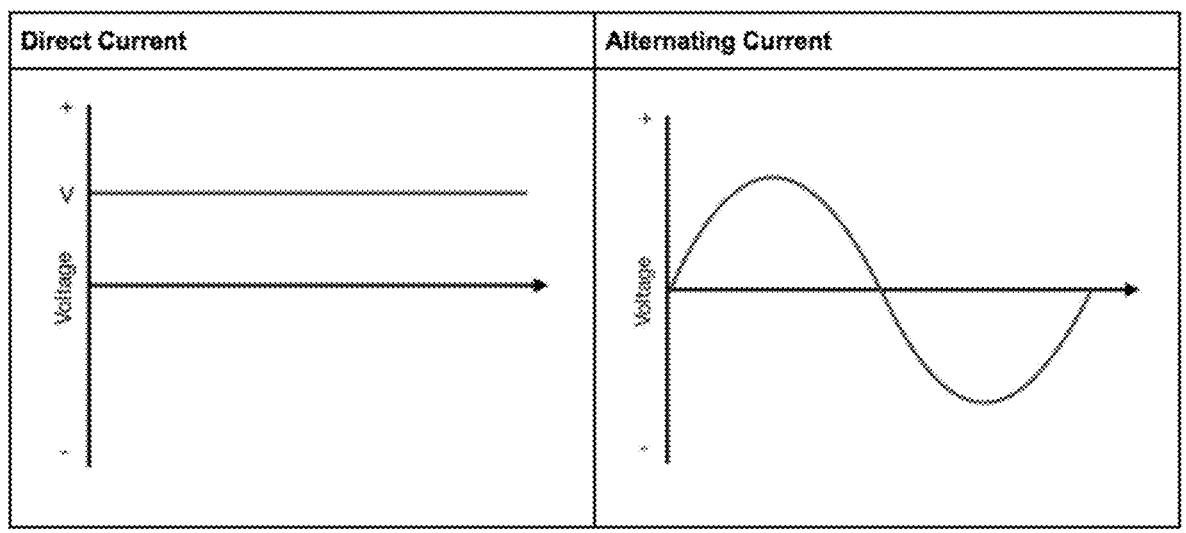
FIG. 3 shows an alternating current (AC) waveform used for AC computing having three states or more.

DC binary computers are reaching their physical limitations. To overcome these physical limitations, a system may be built on alternating current ("AC") for computing. While DC binary computing only has two states, on and off, represented by 0s and 1s, AC computing can have three states or more, as shown in FIG. 3.

Using AC, a computer could have at least three states, represented in 1s, 0s, and −1s or more the intermediate stages of an AC wave are measured, which could be anything between 1 and −1. This can be "Trinary" computing for three state computing and "Trinary Plus" Computing for computing with more than three states. "Trinary Computing" can be a new building block of (+1, 0, −1) using natural states of AC.

While the computing power of a binary computer (whether DC or otherwise) can be measured as $2^n$ (with each 'on' and 'off' representing a "bit"), three state computing would give the ability to compute at the power of $3^n$ (with each '+voltage', 'zero voltage' and '−voltage' representing a "Trit"). This can also be achieved by three stages of current ('+Amp', 'zero Amp' and '-Amp'). The development of Trinary or Trinary Plus computers would result in computers that are potentially millions of times more capable in terms of processing speeds without having to test the physical limitations of silicon through miniaturization. Vastly superior processing speed, memory, and storage could be achieved using Trinary or Trinary Plus computing with greatly reduced energy consumption associated with processing and associated cooling.

A Trinary computer may rely on the use of triodes (which would be a new use for triodes), and would use AC power instead of DC power.

Binary computers are built upon a framework of billions of transistors contained within the Central Processing Unit (CPU), Random Access Memory (RAM), Solid State Drive (SSD) and Graphics Processing Unit (GPU). These transistors are solid state semiconductors made by lithography and doping techniques applied to silicon wafers, creating PN junction diodes. Essentially, each diode is a transistor capable of running only on DC power in an 'on' and 'off' state known as binary. The computing power of a binary computer can be measured as $2^n$. Each 'on' and 'off' represents a 'bit'. The Trinary computer may rely on triodes and use AC power. In contrast to binary computing, Trinary computing and Trinary Plus computers will be able to handle a minimum of three stages (+1, 0, −1) to enable the ability to compute at the power of $3^n$.

Current computer architecture is built on logic using Truth Tables of Boolean algebra. Boolean algebra defines everything in two states of 'True' or 'False', or 'zero' or 'one', which is commonly referred to as binary logic.

A system using Trinary computing may rely on a non-Boolean logic approach where everything cannot be represented by just True or False. A representation of trinary logic would be Absolute True (T), Absolute Neutral (N), and Absolute False (F). Although there are an infinite number of possibilities between Absolute True and Absolute False, each T, N, F may be extrapolated as 'Absolute Positive' (also known as 'True'(T)), 'Neutral' (N) and 'False' (F)). In mathematical logic: T=+1, N=0 and F=−1. F may also be represented as 2, instead of −1). For building simple electronic devices to complex super computers, the T, N, F can also be denoted as 0, 1, 2 for ease of understanding and creating 'Trinary Computer Logic'. Ultimately the symbols represent three or more states of alternating electric current; between positive, neutral and negative.

For each situation, the first three primary outcomes are
a. True (T);
b. Neutral (N); or
c. False (F).
If 'a', the next three possible outcomes are:
a1. TT or (1,1);
a2. TN or (1,0); or
a3. TF or (1,−1) or (1,2).
If 'a1', the next three possible outcomes are:
a1(i) TTT or (1,1,1);
a1(ii). TTN or (1,1,0); or
a1(iii). TTF or (1,1,−1) or (1,1,2).

Accordingly, a system using Trinary computing may rely on three stage computing (i.e. 3×3×3×3 . . . $3^n$) using AC.

Figure 4:
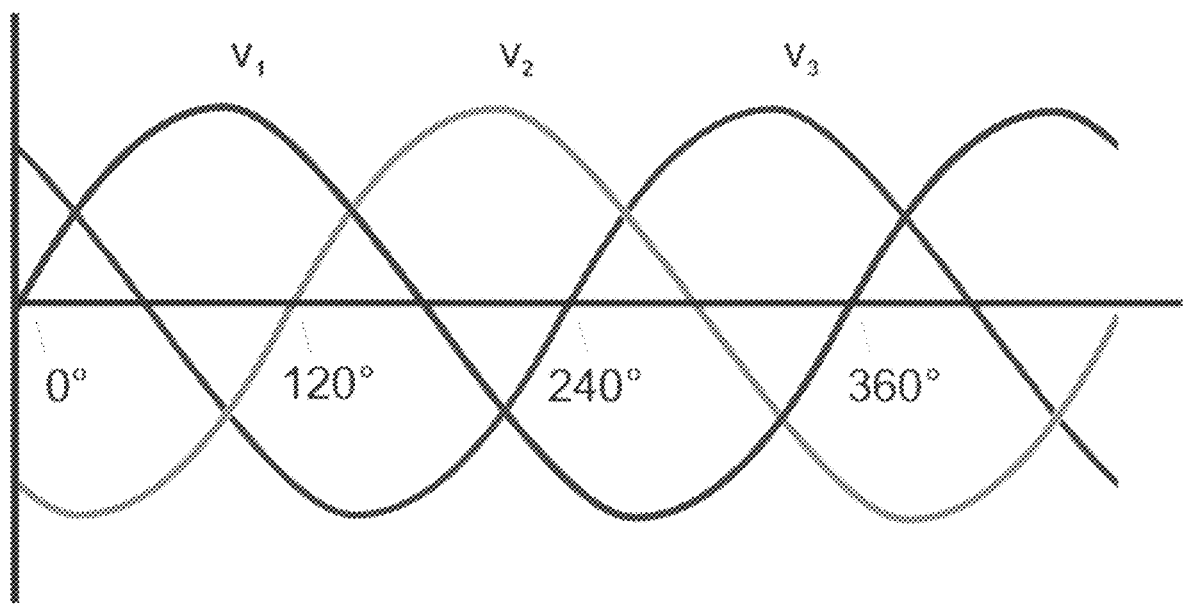
FIG. 4 shows waveforms of three stages of AC that can be used to achieve faster clock speeds and/or parallel processing.
Figure 5:
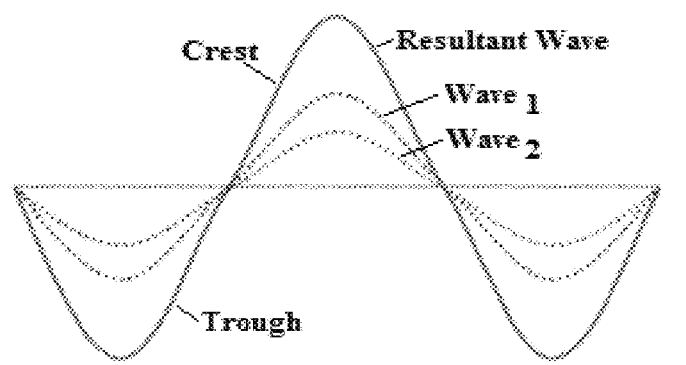
FIG. 5 shows additional waveforms of three stages of AC that can be used to achieve faster clock speeds and/or parallel processing.
Figure 5:
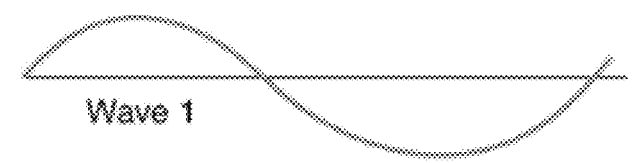
Figure 5:
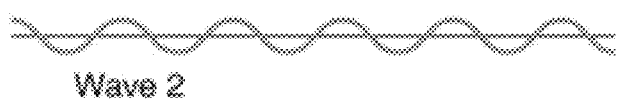
Figure 5:
Figure 5:
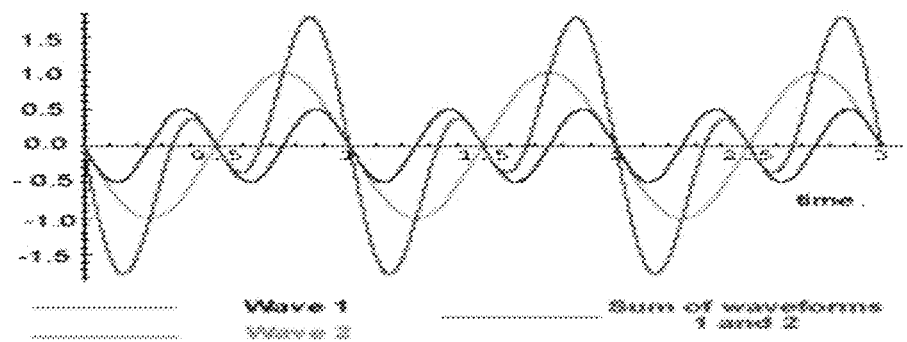

Using three stages of alternating current, we can achieve faster clock speeds and/or parallel processing can be achieved, as shown in FIGS. 4 and 5.

By using different wave forms of electricity, it is also possible to achieve more than three states as a base by using intermediate points between 1, 0 and −1 (e.g. 0.75, 0.5, 0.25, −0.25, −0.5, −0.75), on the AC wave, thereby achieving computing on $3^n$, $4^n$, $5^n$, $6^n$, $7^n$, $8^n$ . . . $x^n$ etc., as shown in FIG. 5.

Current computers are built on a framework of transistors, embedded within semiconductors using direct current and binary logic in its state of 0s and 1s ('on' or 'off'). A trinary computing system may use alternating current and have the ability to use three or more states (numbers between +1, 0, −1).

Figure 6:
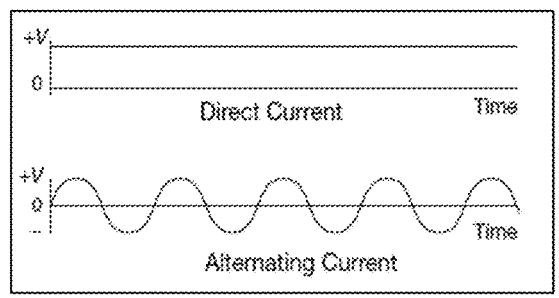
FIG. 6 shows diagrams of triodes and Triode for Alternating Currents (TRIAC) for a Trinary Computer using AC.
Figure 6:
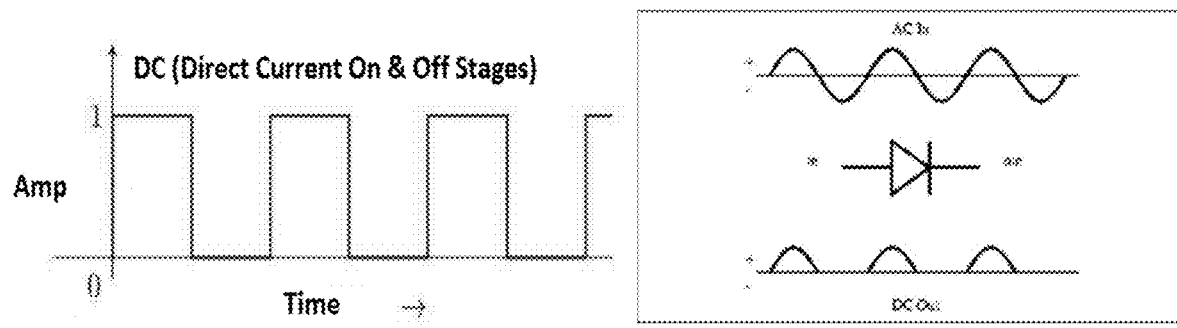
Figure 6:
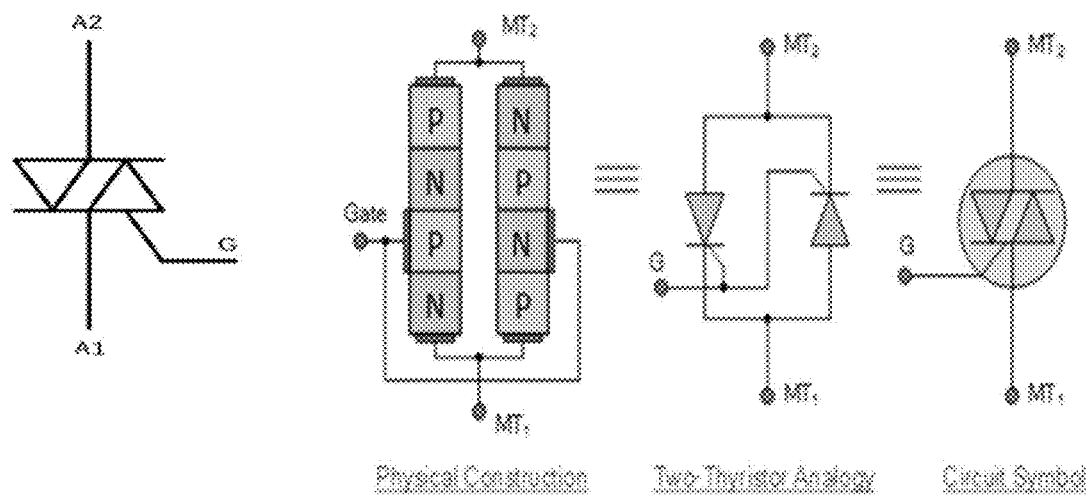
Figure 6:
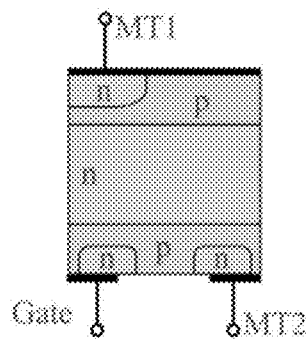

A diode on and off state may produce wave forms as per FIG. 3 and FIG. 6 below. By using a combination of diodes, also known as a 'Triode' or a Triode for Alternating Currents (TRIAC) (FIG. 6), the basis of a Trinary Computer using AC may be achieved.

Figure 7:
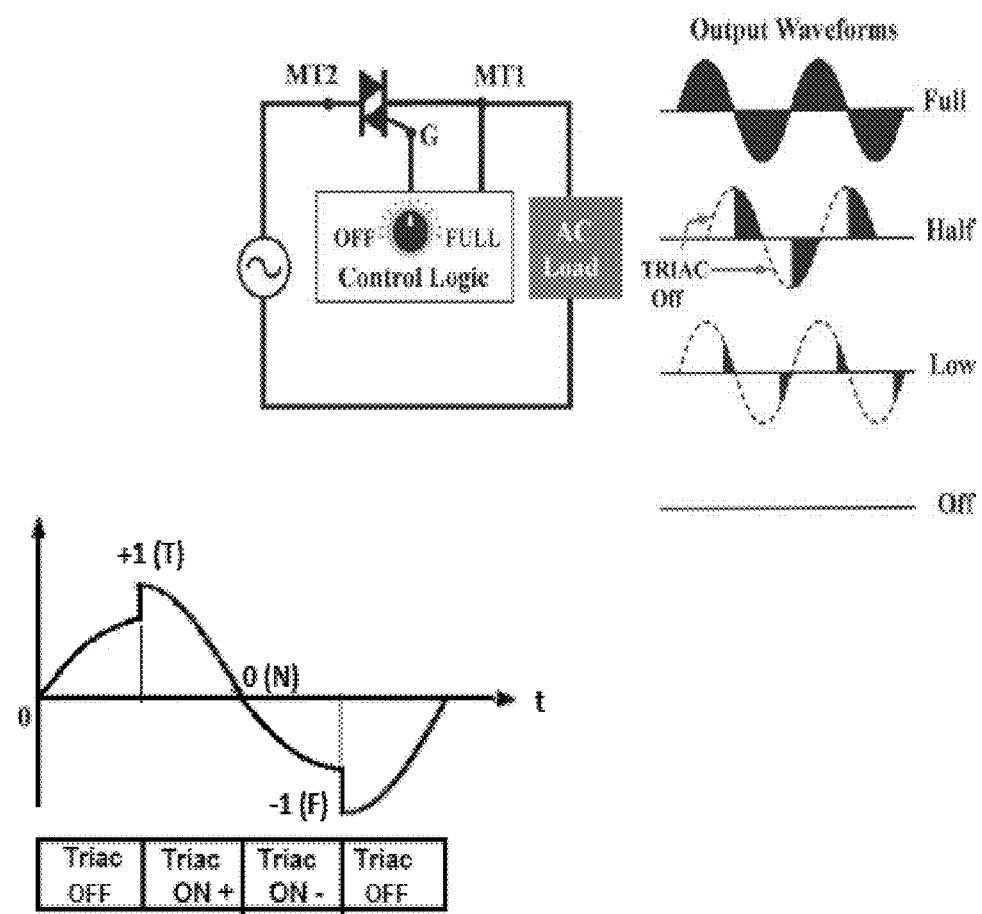
FIG. 7 shows diagrams illustrating how TRIACs can be repurposed for trinary computers.

TRIACs are presently used as fan speed regulators and light dimmers. A Trinary computer may repurpose TRIACs for Computers and Computing Logic, as shown in FIG. 7, to achieve three or more states instead of binary (on and off).

Computer 'Logic' in this case is the rationale that makes a mechanical device or electrical circuits function as a computer. Binary Logic works on two variables; 'True' and 'False' (or '0' and '1'). This logic is implemented using diodes and Boolean algebra.

Trinary and Trinary Plus logic works on three or more variables, respectively. (T,N,F), (1,0,−1) or (1,0,2), and up to as many intermediate steps (e.g. 1, 0.75, 0.5, 0.25, 0, −0.25, −0.5, −0.75, −1), may be used in the case of Trinary. In the case of Trinary Plus, the number of variables and intermediate steps are distinguishable/measurable. Trinary can also be stated as 0, 1, 2 for mathematical calculations.

Figure 8:
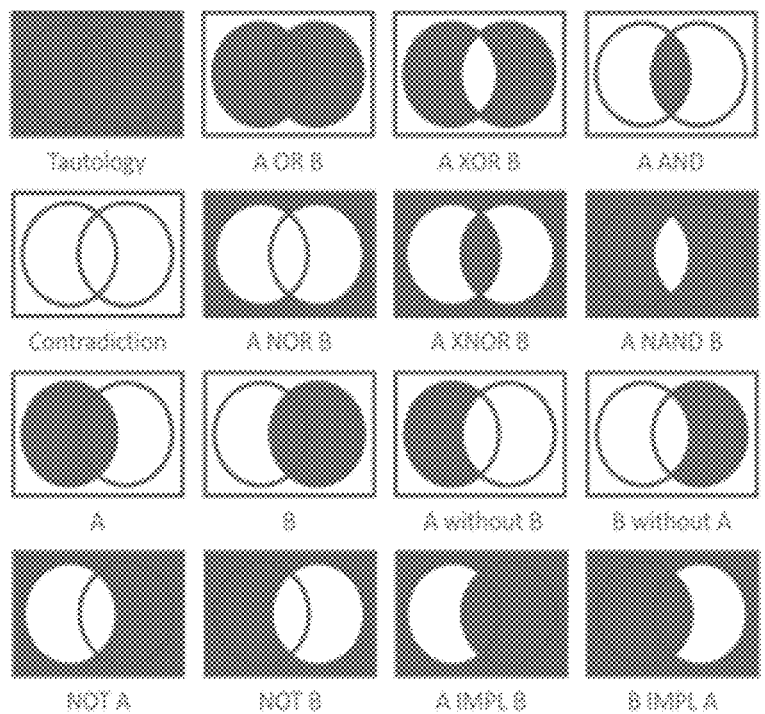
FIG. 8 shows Venn diagrams, and a chart for logic gates.

A logic gate is a level of abstraction of electrical circuits used to represent the electrical circuits and the desired algebra or logic that is required to be calculated or computed. The shape in which the logic gates are represented are for ease of identification. The basic computing logic gates are an 'AND Gate', 'OR Gate' and 'NOT Gate' which can be further abstracted to form the 'NAND Gate' (NOT AND Gate), 'NOR Gate' (NOT OR Gate), 'XOR Gate' (Exclusive OR Gate), 'XNOR Gate' (Exclusive NOT OR Gate). These are applied as binary logic in Boolean algebra, and represented as two possible outcomes of True or False, represented as 0 and 1. A Truth Table is a set of rules, or a function of each logic gate, in the way it should give a resultant output for inputs. These functions can be understood with the help of Venn diagrams, as shown in FIG. 8.

While 'Binary Gates' use two inputs (A and B), 'Trinary Gates' may use three inputs (A, B and C).

The number of resultant output possibilities in 'Binary Logic' is $2^2=4$, versus $3^2=9$ possibilities in 'Trinary Logic'. These increased possibilities can be translated to reduce circuit cycle time, eventually leading to increased computation power, speed and storage. The time taken to process 2 bits inputs and 1 bit outputs with four possibilities, versus the time taken to process 2 Trit inputs and 1 Trit output with nine possibilities, is shown in FIG. 9.

Figure 9A:
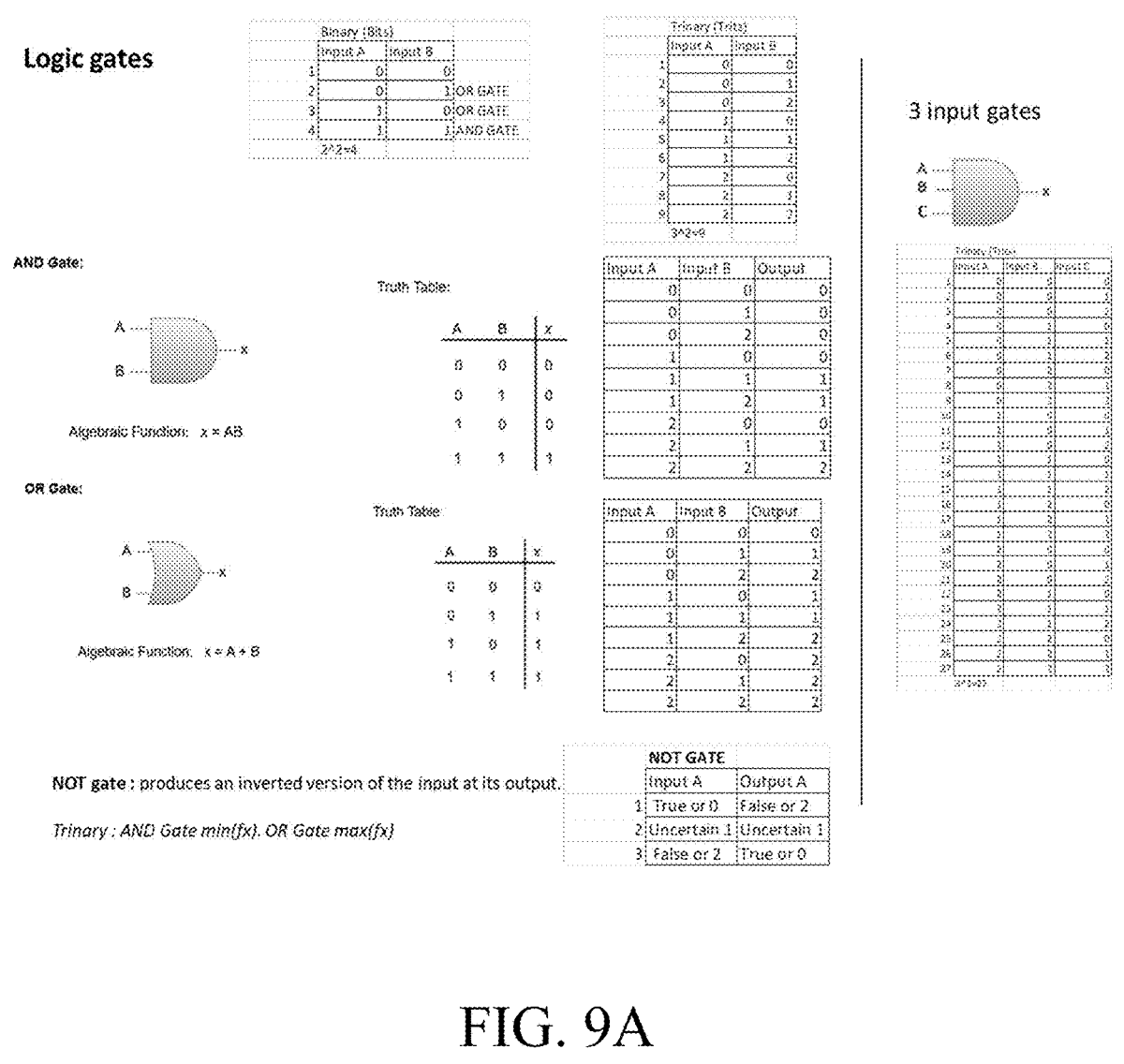
Figure 9B:
FIG. 9B shows diagrams of logic gates and truth tables.
Figure 9B:
Figure 9B:
Figure 10:
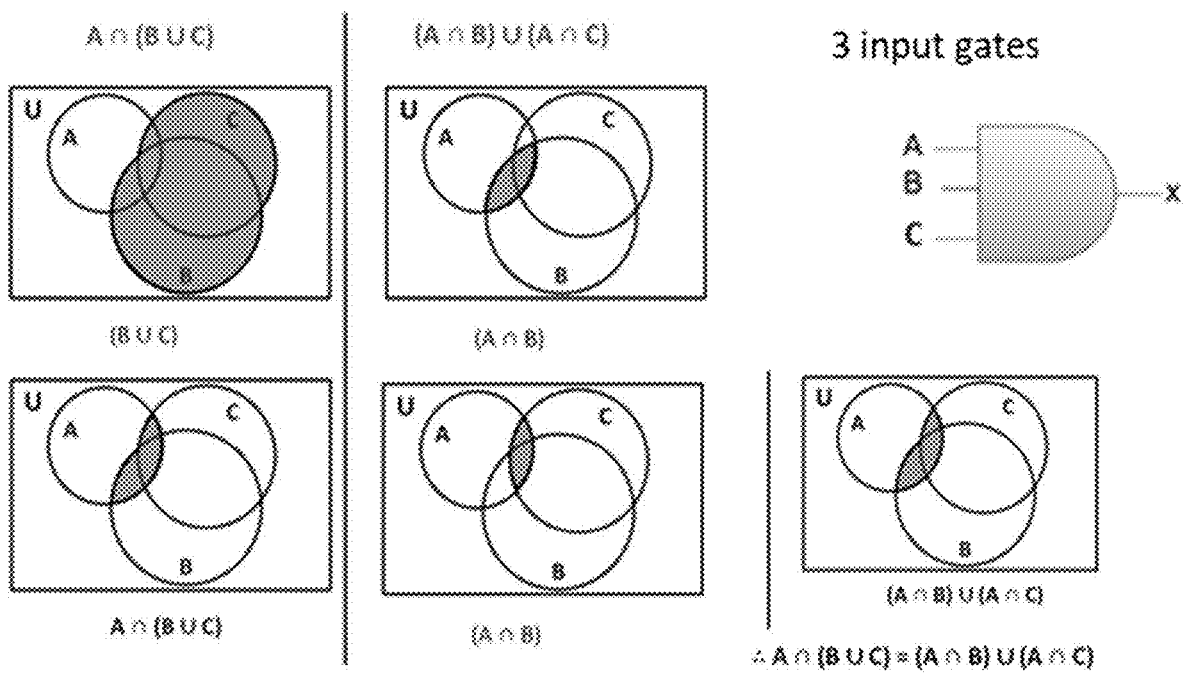
FIG. 10 shows diagrams of distribute laws of sets for a three input logic gate.

The natural state of Trinary is base 3 or $3^n$, hence it is possible for a Trinary Computer to be based on a logic that utilises 3 inputs and produces 27 possibilities, as shown in FIGS. 9A, 9B, and 10.

Figure 11A:
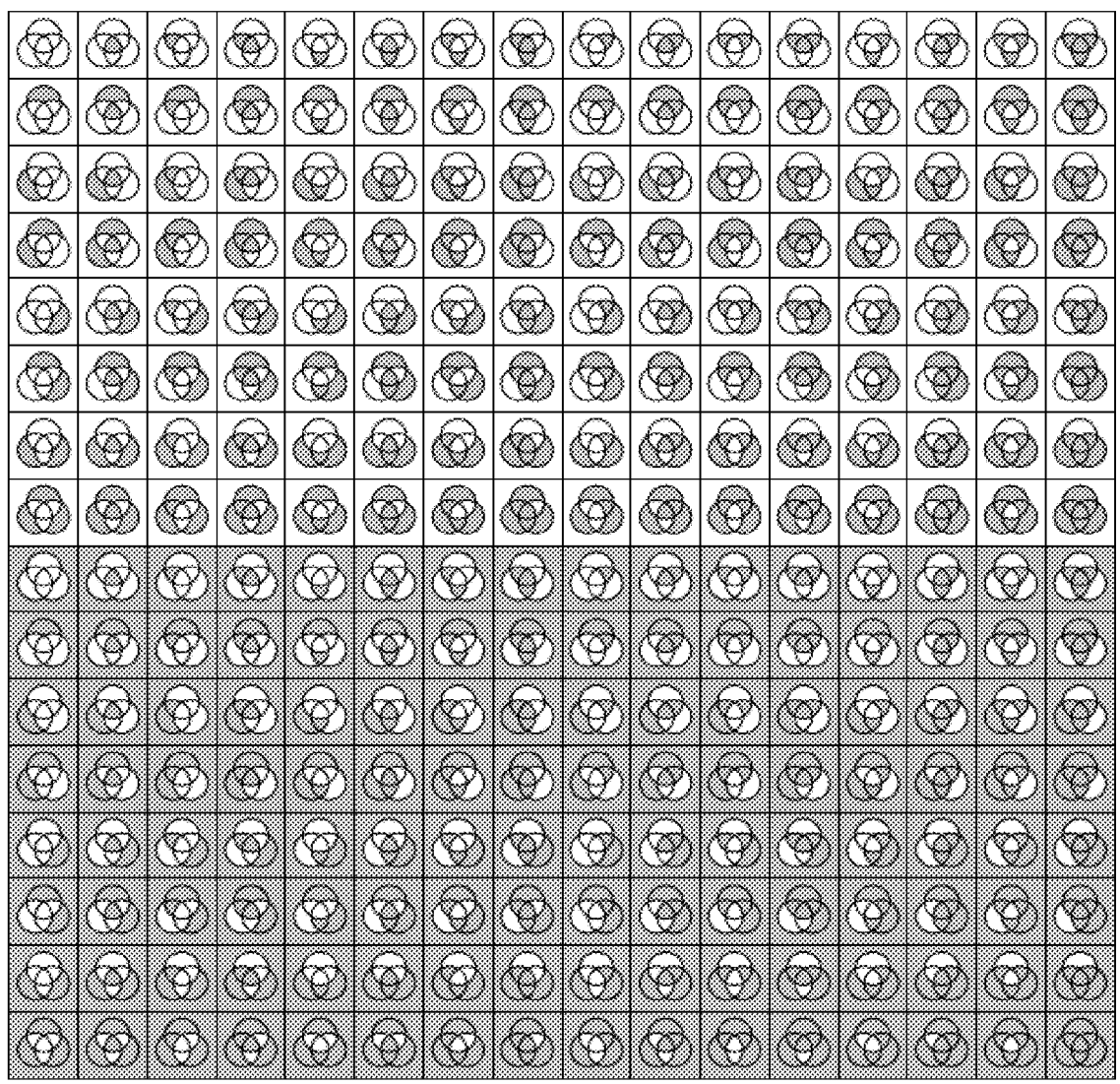
FIG. 11A shows a diagram of logic functions at the trit level.

A Trinary computer not only provides more computing power at the trit level, compared with the bit level, at each incremental stage of the electrical circuitry ($3^n$ vs $2^n$) but also has the ability to assign more functions (i.e. new 'Logic Levels' abstractions) at much earlier stages of the circuitry when compared to binary; this significantly helps in complex computing and the building of super computers, as shown in FIG. 11.

One of the simplest functions of a computer is algebra. Algebra involves the addition of two single digit numbers. Unlike the decimal system, which relies on the numbers 0, 1, 2, 3, 4, 5, 6, 7, 8, 9, binary uses 0, 01, 10, 11, 100, 101, 110, 111, 1000, 1001, and Trinary uses 0, 1, 2, 10, 11, 12, 20, 21, 22, 100, respectively.

To represent the decimal integer 255, a binary computer has to rely on 8 bits (8 bits is further explained as $2^n$ where $^n$ denotes the layers of complexity, in this case three). Complexity, like abstraction, helps in understanding the layering principal of adding more circuitry. It is no coincidence that computer architectures work with 2 bit, 4 bit, 8 bit, 16 bit, 32 bit and 64 bit architectures ($2^n$) as these numbers represent a matrix, an array, or a tabular format to extend logic and create various levels of abstraction. It is possible to build a 7 bit architecture or a 19 bit architecture, but the building blocks that are added or multiplied from a base number of transistors, such as 50 billion transistors, become too complex. This principle is applied to everything including memory and storage.

Figure 12A:
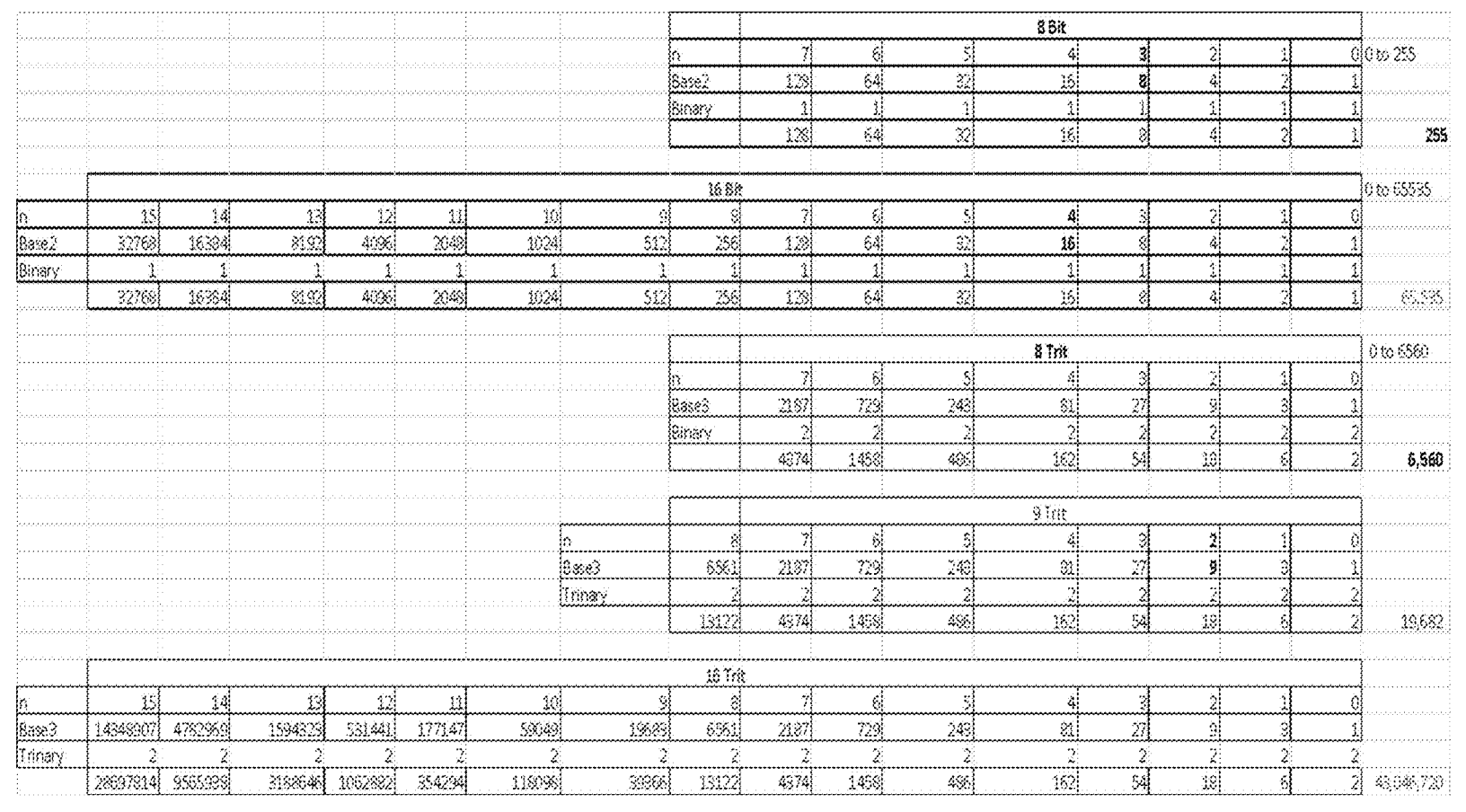

8 bits can represent $2^8$ integer numbers from 0 to 255 or 256 numbers. In the case of trinary, 8 Trit (i.e., $3^8=6561$) can represent 0 to 6560 or 6561 numbers. Accordingly, 64 bit binary architecture would be comparable with 64 Trit trinary architecture, which could represent more than 186 billion more possibilities, or simply 186 billion more times, as shown in FIG. 12B. Comparing 8 bit vs 8 Trit, the gain in computing power is 25 times or 2,500%. Comparing 16 bit vs 16 Trit (65,535 vs 43,046720), the gain in computing power is 655 times or 65,500%. Comparing 32 bit vs 32 Trit, the gain in computing power is 431,440 times. The current 64 bit architecture vs 64 Trit architecture the gain in computer power is 186 billion times, as shown in FIG. 12B.

Figure 13:
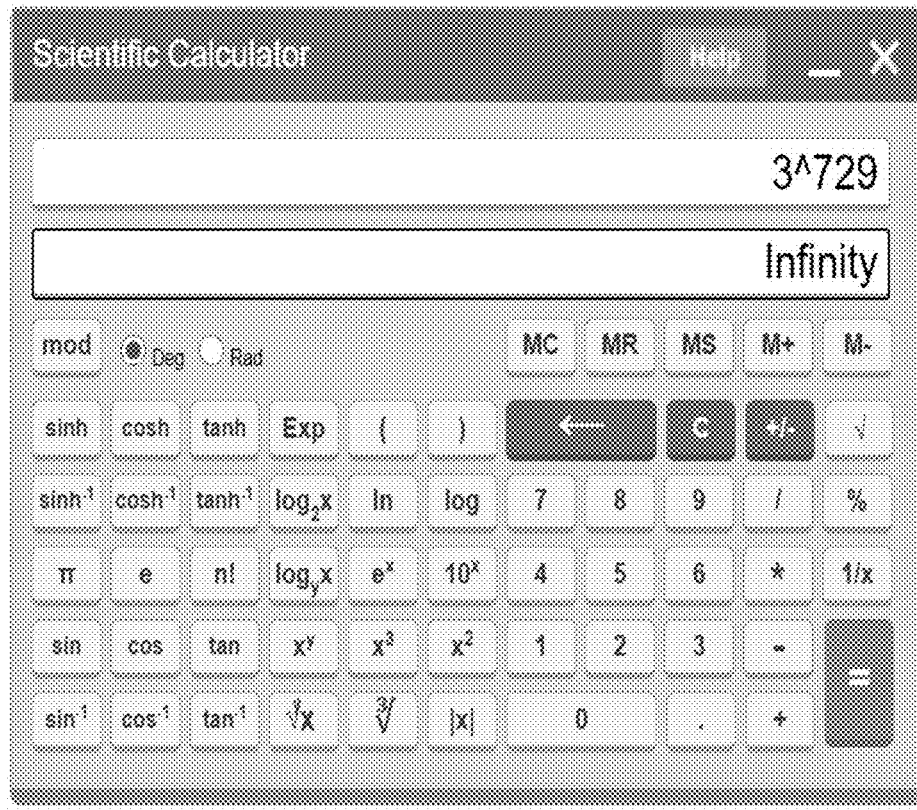
FIG. 13 shows diagram of computer calculators displaying trinary equivalents of 64 bit binary architecture as infinity and error.
Figure 13:
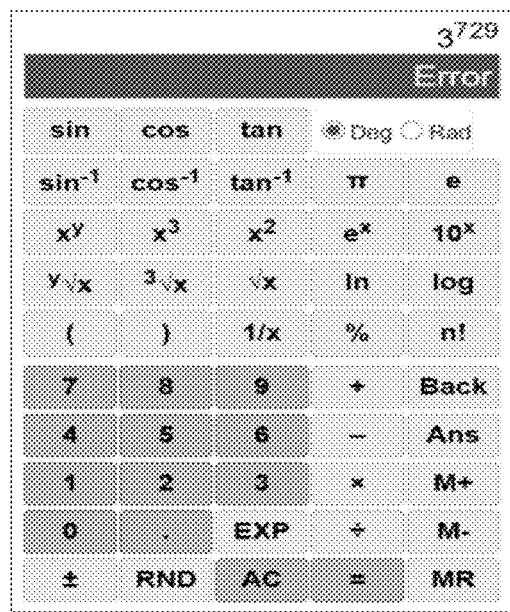

Complexity as mentioned above may be defined as a type of major abstraction to understand how binary 0s and 1s (on and off) and the resultant tasks performed in a grid, array, or matrix of repeating electronic sequences of the logic gates (logic gates are also an abstraction of diodes and transistors) can make the functioning of a computer possible. This definition may not be an industry standard and instead may be a proprietary method developed to demystify computers. Current computers use 64 bit ($2^6=64$) binary architecture; an equivalent level of abstraction and complexity for $2^6$ binary architecture would be $3^6$ Trinary, or 729 Trit architecture. Modern PCs, and their scientific calculator equivalents, give a numerical result up to $3^646$ and represent $3^729$ as infinity or as an error, as shown in FIG. 13.

Trinary Computers can use lesser levels of abstraction and complexity (i.e. $2^6=64$ bit architecture vs $3^4=81$ Trit architecture), but still achieve a staggering computing gain of 186 billion times (considering a 64 Trit architecture and not 81 Trit which would be even greater), or maintain the same levels of abstraction and complexity as a binary system (n=6) (i.e. 729 Trit architecture vs. 64 Bit architecture) and still achieve super computer power with existing consumer digital device technology and electronics.

Counting in decimal numbers may add a new digit (carry) once the numbers 0 to 9 are sequentially utilized. Similarly, in computing a new digit called bit/trit is added once the sum reaches its maximum variable, such as 1 in the case of binary and 2 in the case of trinary, respectively, as shown in FIG. 14.

In binary and trinary computers, addition and algebra are undertaken using 'half adders' and 'full adders'.

Figure 15:
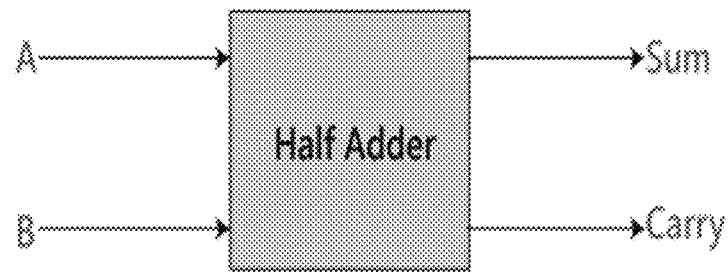
FIG. 15 shows a diagram of a half adder and corresponding truth tables.

The 'Half Adder' adds two single trinary digits and three single trinary digits, A+B and A+B+C, respectively. It has two outputs, sum (S) and carry (C). The carry signal represents an overflow into the next digit of a multi-digit addition. A comparative truth table of a 2 input 1 bit half adder vs a 2 input 1 trit half adder is shown in FIG. 15. The addition of two single 1+1 in binary will give a result of carry 1 and sum 0, represented as binary number 10 and decimal number 2. In comparison, the addition of two single 1+1 in trinary will give a result of carry 0 and sum 2, represented as trinary number 02 and decimal number 2, as shown in FIG. 15.

Figure 16:
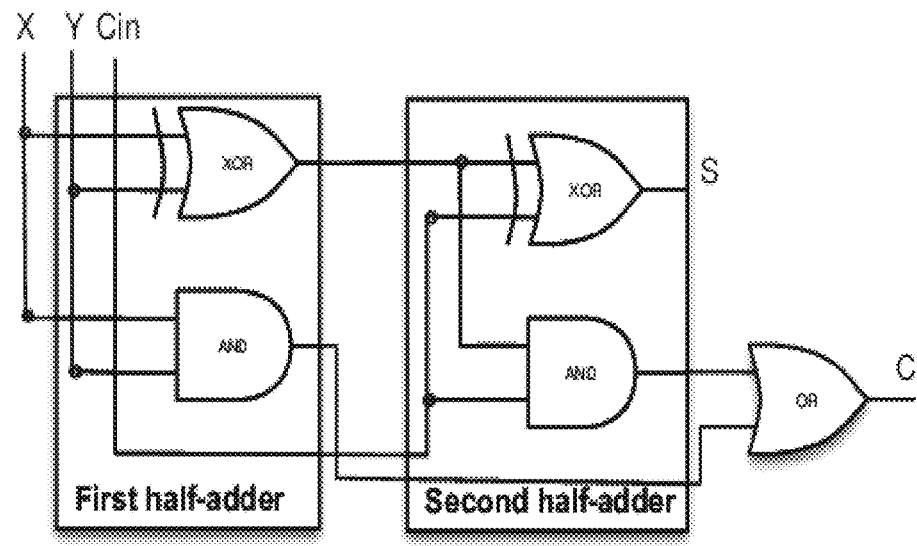
FIG. 16 shows diagrams of a full adder.
Figure 16:
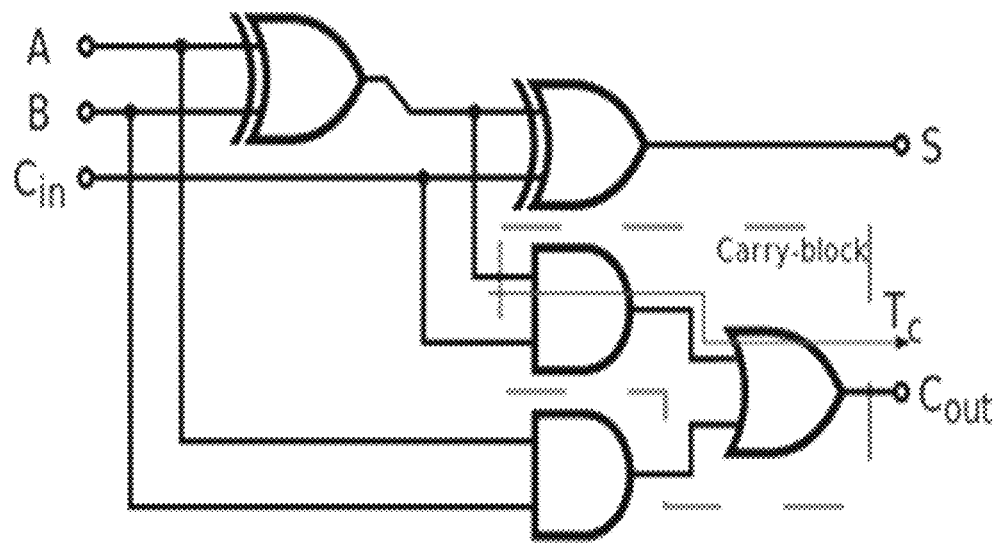
Figure 16:
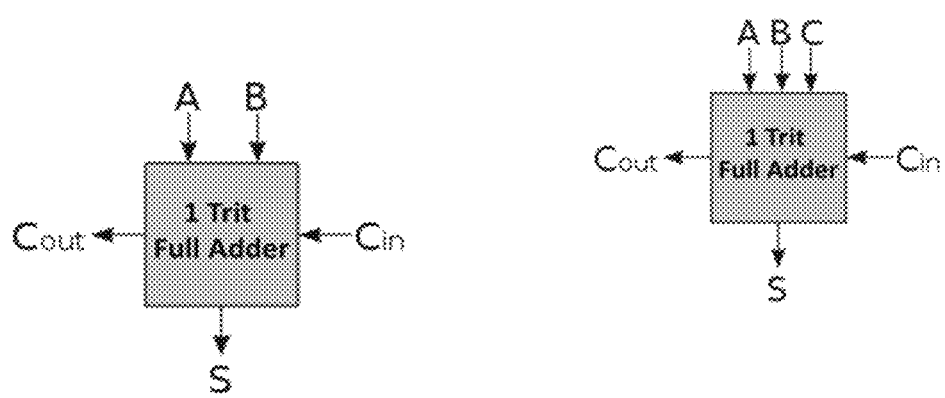

The Full Adder, which is two Half Adders connected in series, adds binary or trinary numbers and accounts for values carried in as well as out, and can be connected in series as well to get a final sum without a carry (e.g. of 2 digit trinary with carry in) and gives the result as an S and a C. A logical abstraction for Trinary Computing may use 1 Trit Full Adder with two inputs, and 1 Trit Full Adder with three inputs, as shown in FIG. 16.

Figure 17:
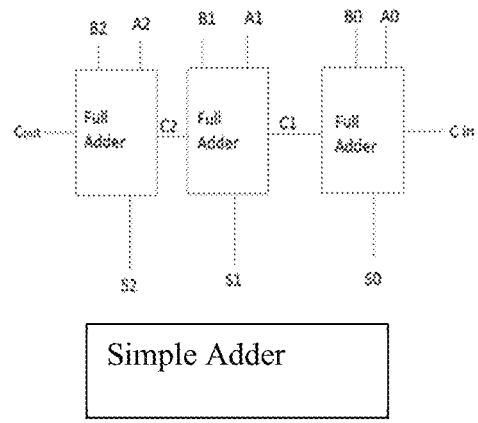
FIG. 17 shows diagrams of a simple adder, a trit carry look-ahead (CLA), and a trit look-ahead carry unit (LCU).
Figure 17:
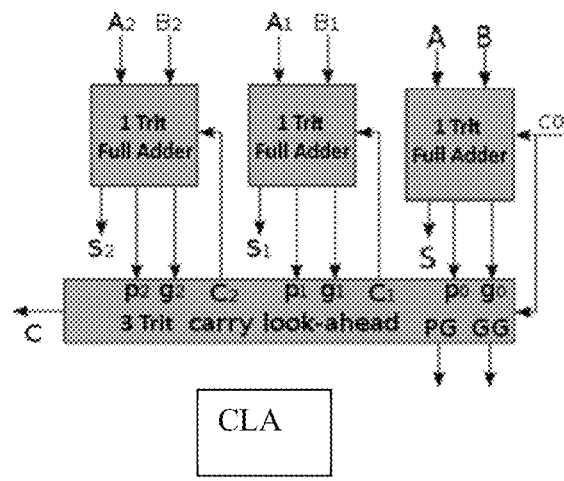
Figure 17:
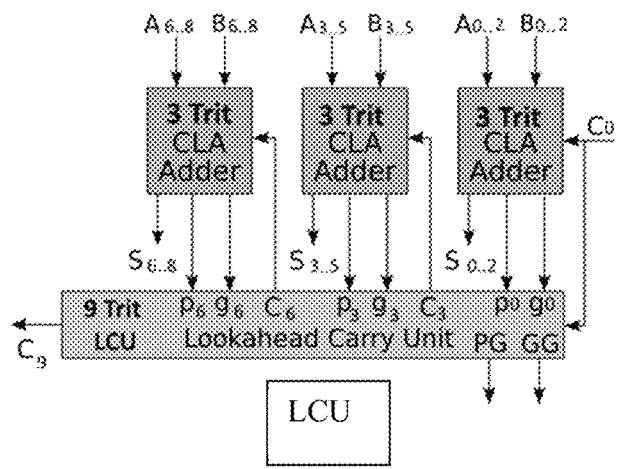

A Three Trit Carry Adder ("CA"), a Three Trit CLA (carry look-ahead), a Nine Trit CLA, a Nine Trit Look-ahead Carry Unit ("LCU") are again layers of abstraction, like in the case of binary, and can receive inputs in Trits or bits as per the electronic circuits and use of AC or DC power respectively, as shown in FIG. 17. The matrix, array, or the combination of these logic layers follows a $3^n$ in trinary vs $2^n$ of binary. It is important to note that each Trit level can carry 50% more information than a bit thereby making the computing gain exponential.

A 'Carry Look-ahead Adder' ("CLA") is a much faster adder when compared to a CA. The simple CA calculates the carry Trit/Bit alongside the sum Trit/Bit, and each stage must wait until the previous stage. The CLA calculates carry Trits/Bits before the sum.

A 9 Trit CLA is the same as a 3 Trit CLA connected in series of 9×1 'Trit Full Adders'.

LCU is the name of a logical unit to be used in conjunction with CLAs to construct computing logic.

Three 9 Trit CLAs along with a look-ahead carry functions results in a 27 Trit LCU.

Figure 18:
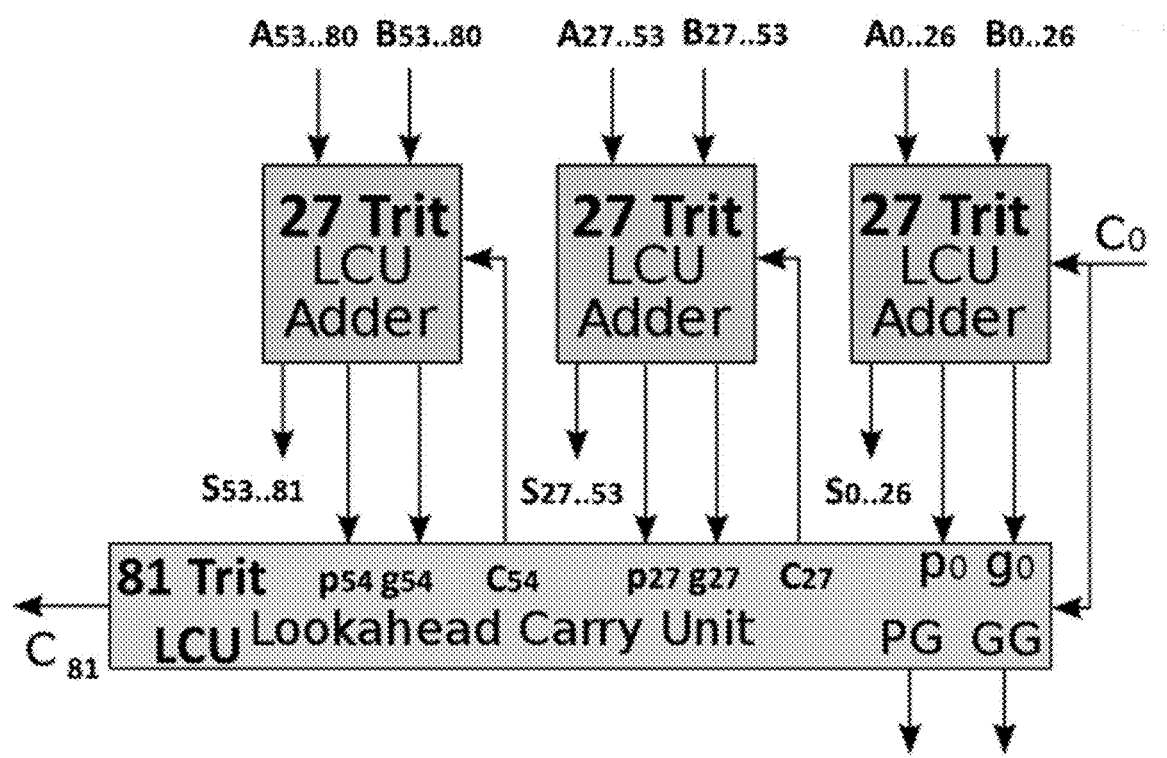
FIG. 18 shows a diagram of a combination of three 27 trit LCUs and a 81 trit LCU.

A combination of three 27 Trit LCUs with a look-ahead carry function results in a 81 Trit LCU, as shown in FIG. 18.

The Arithmetic Logic Unit ("ALU") is a level of abstraction of the Trinary logic gates to represent arithmetic and logic functions.

Figure 19:
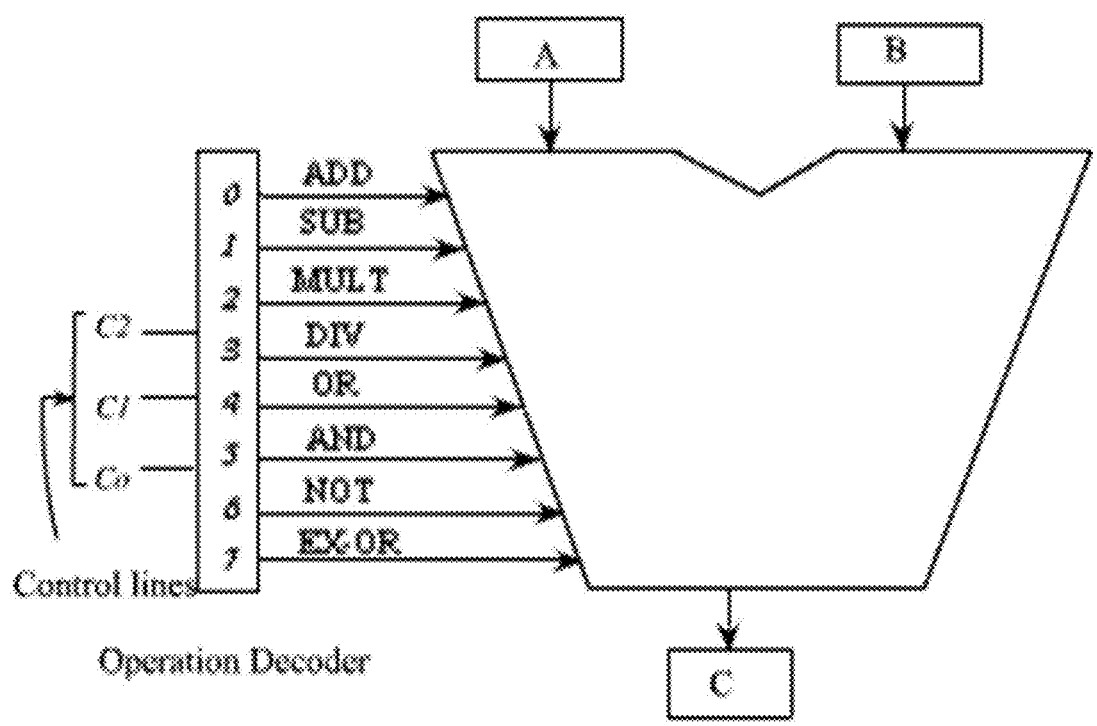
FIG. 19 shows a diagram illustrating various ALU operations.

ALU operations, at the simplistic levels, includes add, subtract, and, or, not, shift left, shift right, swap, as shown in FIG. 19.

With the combination of various logic units (levels of abstraction) the different components of computing parts may be built.

Figure 20:
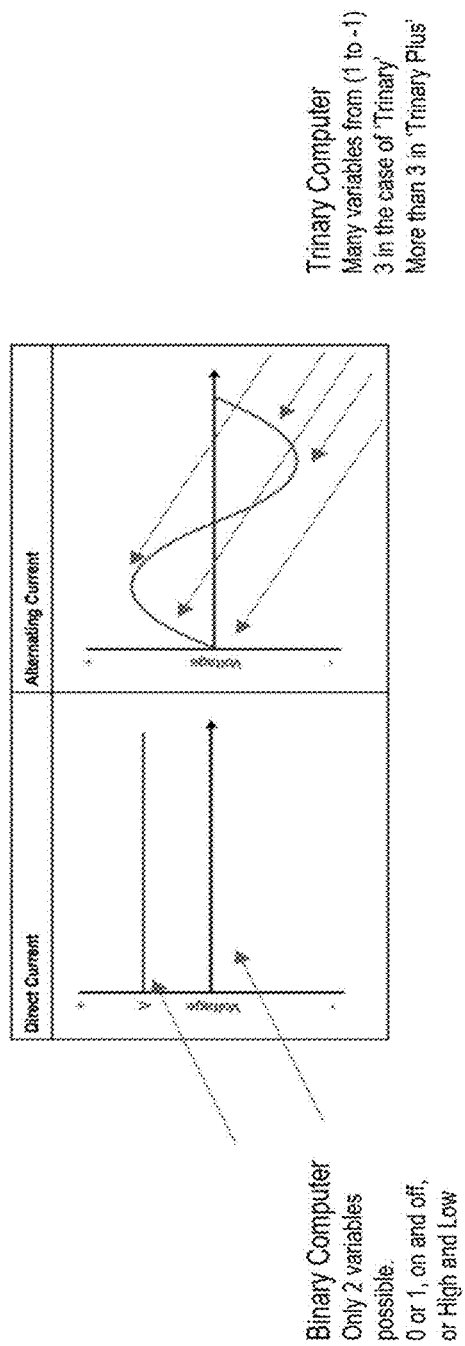
FIG. 20 shows a chart of waveforms used for a binary computer and a trinary computer.
Figure 21:
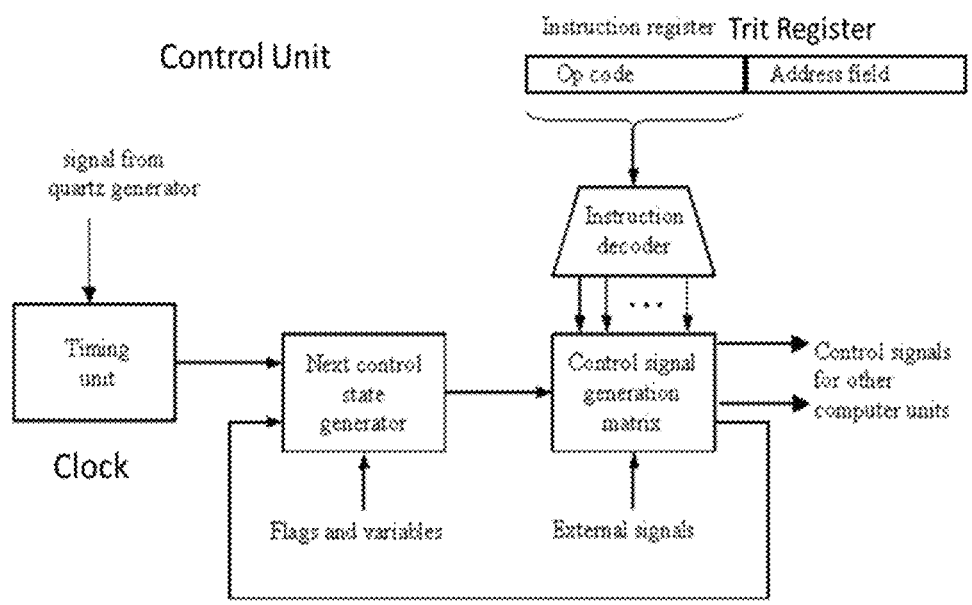
FIG. 21 shows diagrams of a control unit and a central processing unit (CPU).
Figure 21:
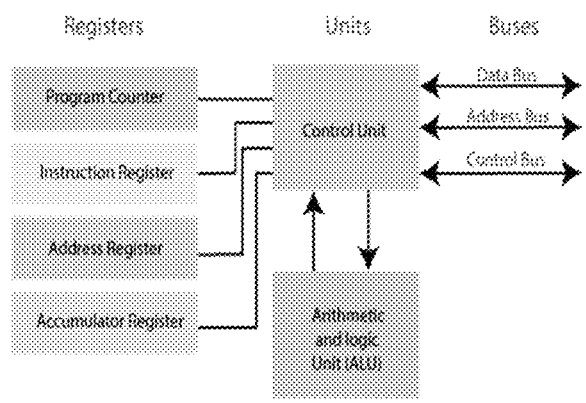

The Control Unit, shown in FIG. 21, may use a set of instructions, also known as micro-programs or machine code, which are either hardwired into the processor or contained within another microprocessor with a similar set of instructions. The Control Unit may direct the computer's memory, ALU, and input/output devices how to respond to the instructions sent to the processor. The Control Unit may direct the timing and control signals and the flow of data between the CPU and devices. The Control Unit may also control the 'bus' directly or via a bus controller and operate the registers. The major difference between a Control Unit in binary and trinary computer may be that the clock in a binary system gives a high and low signal referred to as switching on and off or 0 and 1 and a binary computer is incapable of accurately reading a signal or a variable between 0 and 1 making more than 2 variables unviable in a binary computer. While a Trinary computer would be a wave form with 3 variables and more, which can be read accurately to make a Trinary and Trinary Plus computer, as shown in FIG. 5 and FIG. 20.

Registers are fast storage devices which can store up to a Trit. (e.g. 9 Trit register, 27 Trit register, 81 Trit register, $3^n$). A processor may contain several types of registers which can be classified according to their content or instructions; a program counter may be a process register indicating the program sequence with respect to the computer, an instruction register may be the set of instruction to be executed currently from a pipeline of instructions, an address register may store addresses of specific memory locations, and an accumulator register may be a short term, immediate storage of arithmetic and logic data, as shown in FIG. 21. A Trinary computer may use a capacity for memory which can store more than 2 states of energy thereby giving three resultant Trit values enabling $3^n$ ability and computing gain vs binary computers giving only two resultant 2 bit values. Each Trit level can carry 50% more information than a bit equivalent thereby making the computing gain exponential.

Buses are called data highways and would have a width represented in Trits (e.g. 90 Trit width).

Registers may be abstracted, along with logic gates, to form specific type of 'memory', such as Random Access Memory ("RAM") and Solid State Drives ("SSD"). As above, these devices may use registers to store up to a Trit, to store data temporarily (while the computer is on) as in the case of RAM, and for long durations (including power off state) as in the case of SSD. RAM and SSD sizes are in multiples of 3 Trits and form Kilo trits (Kt), Mega trits(Mt), Giga trits, Teratrits (Tt) and so forth. (e.g. 27 Gt of RAM and 3 Tt of SSD storage).

In a binary computer system, 1 GB of RAM and/or SSD equals=8,589,934,592 bits or $2^{92681}$; in an equivalent in Trinary Computer system, similar storage infrastructure would be able to store $3^{92681}$; a number too large to compute without a super computer. For a Trinary computer to store 1 GB of RAM equivalent it would need only $3^{2048}$ vs Binary of $2^{92681}$ of underlying silicon real estate. One 'word' is generally represented by 2 bytes, and 1 byte is 8 bits. One 'word' in Trinary as being represented as 1 Tryte or 9 Trits; or to maintain the same level of complexity 27 Trits may equal a Tryte and 3 Trytes equals a 'Tword' i.e. 81 Trytes.

Presently CPU architecture for binary may be built on 64 bit architecture i.e. $2^{64}$, the Trinary equivalent of $3^{64}$ would be 186 billion times more, as shown in FIG. 12.

Figure 22:
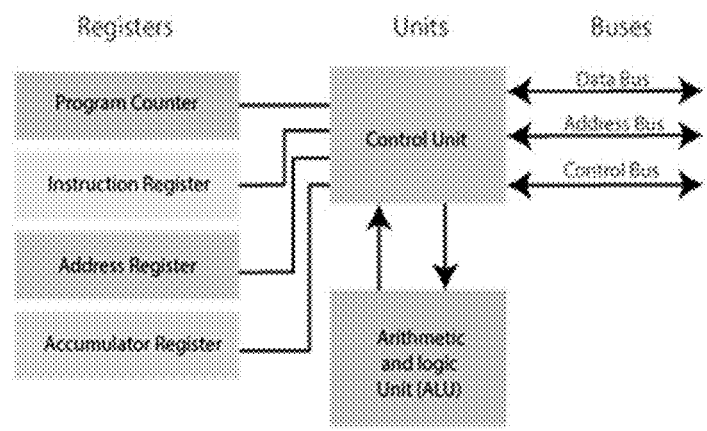
FIG. 22 shows diagrams of a CPU and a graphic processor unit (GPU).
Figure 22:
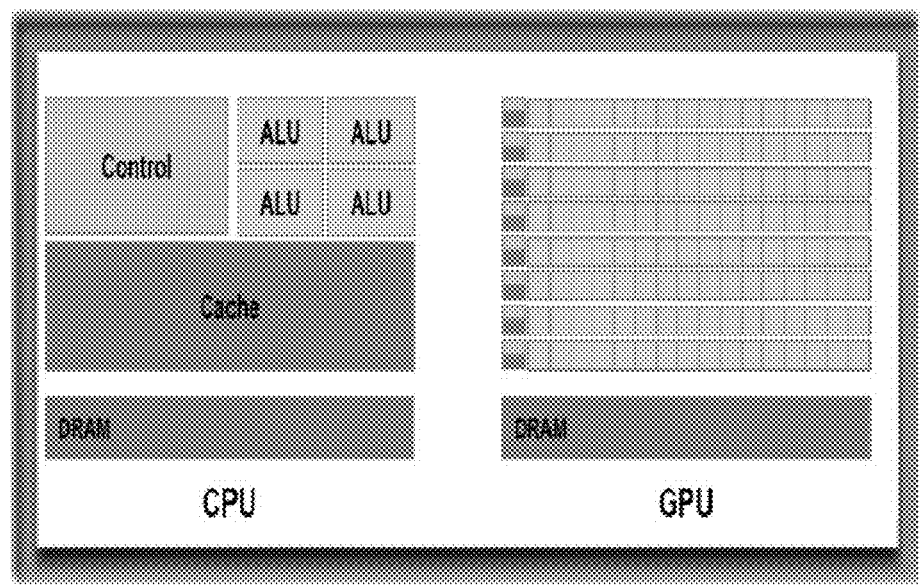

A combination of Control Units, Register (Memory), ALU, Buses, Cache (Memory) and RAM (memory) in its various configurations may make a Central Processing Unit (CPU) and also a dedicated Graphic Processor Unit (GPU), as shown in FIG. 22.

Figure 23:
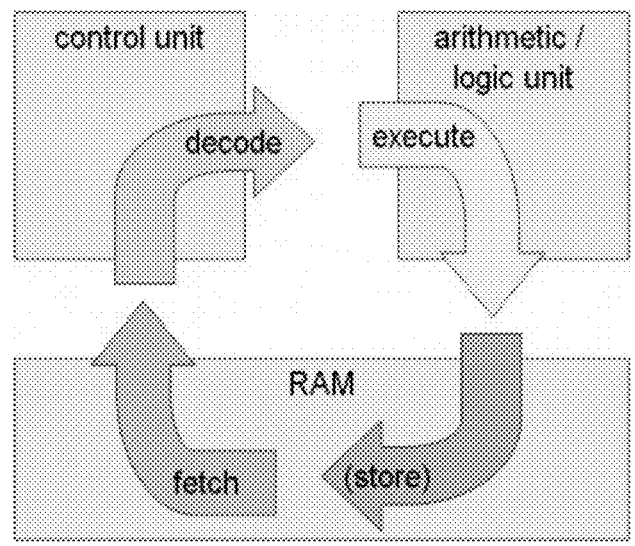
FIG. 23 shows diagrams of clock operation.
Figure 23:
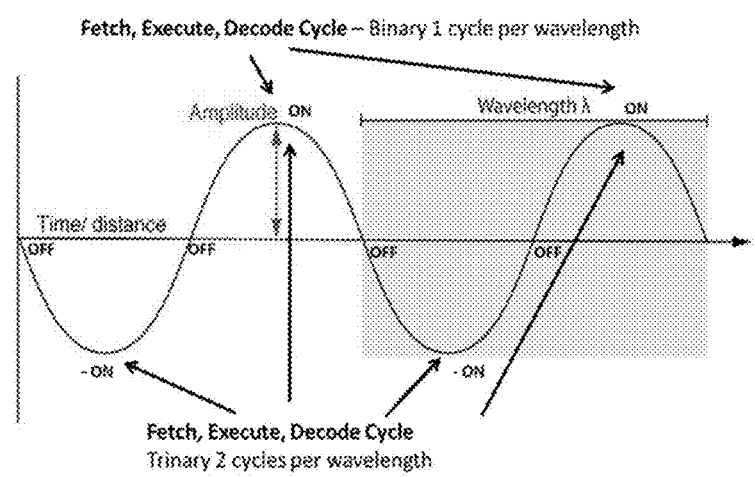

The clock is the Fundamental part of the CPU and specifically the Control Unit. Each clock cycle represents a Fetch instruction, Execute instruction, and Decode instruction cycle, as shown in FIG. 23. The clock of a Binary computer uses DC power, and the clock of a Trinary computer uses AC power, as shown in FIGS. 1, 3, 5, and 6. Effectively, due to the wave electronics of Trinary computers, double the clock speeds of a binary computer can be achieved, as shown in FIG. 23. A simple clock is shown in FIG. 21, and clock operation is shown in FIG. 23.

A Graphics Processor Unit ("GPU") is a type of a CPU designed specifically for graphics and sound (Audio Visual) application also known as a 3D engine.

Figure 24:
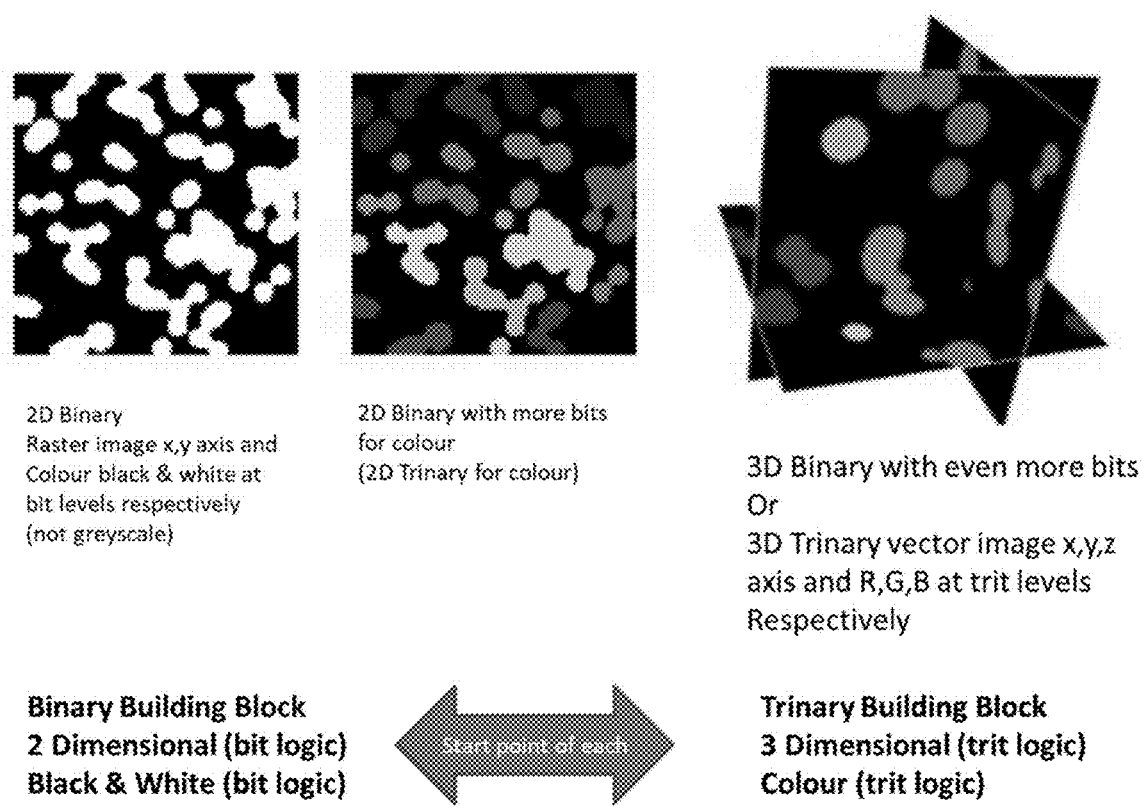
FIG. 24 shows a comparison of binary and trinary building blocks for graphics.
Figure 25A:
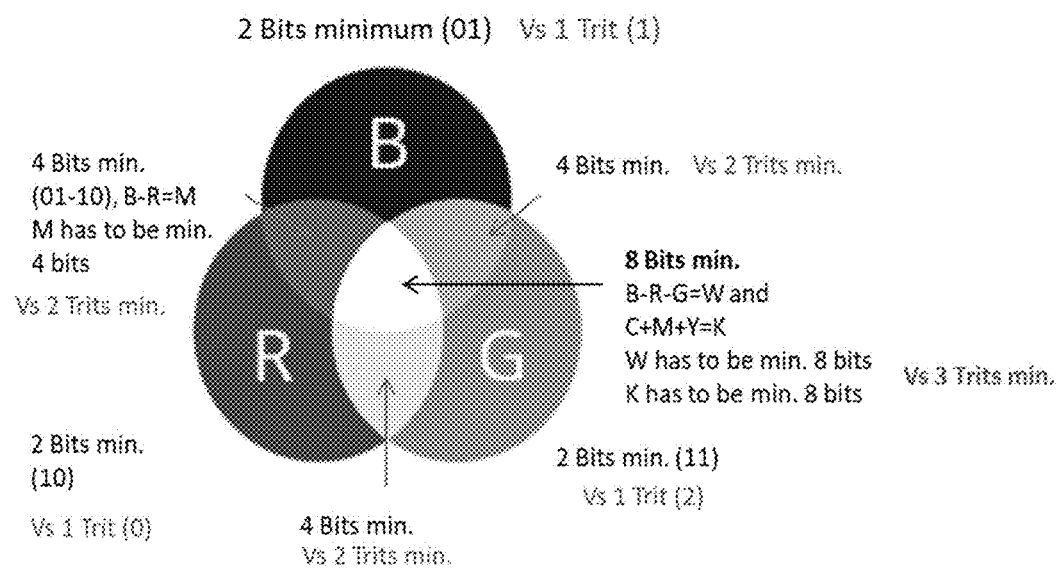
FIG. 25A shows charts and diagrams comparing 1 bit, binary, and trinary equivalents for colors.
Figure 25A:
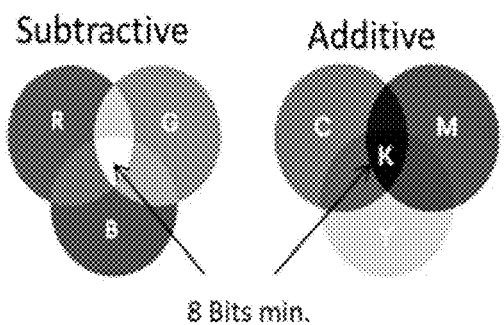
Figure 25B:
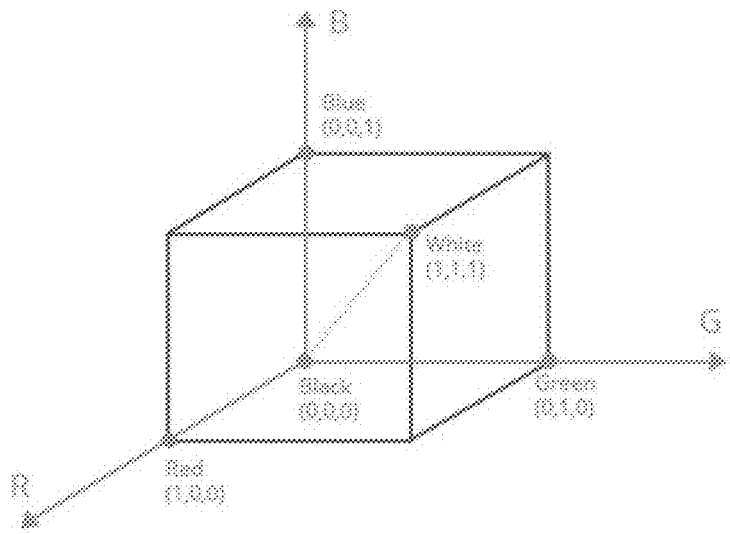
FIG. 25B shows charts and diagrams comparing binary and trinary values used to represent colors.
Figure 25B:
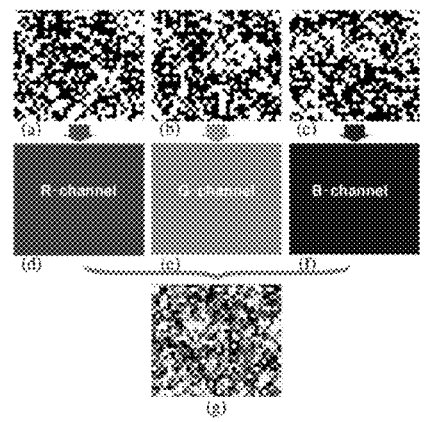

Graphics has a component of three dimensional objects measured on a x, y and z axis, also known as a vector, which is better represented by Trits and trinary circuitry and logic rather than binary, which is better suited for two axis representation or raster. Pixel colours use a combination of Red (R), Green (G), and Blue (B) to produce all the available colours. This can be more easily represented using Trits and trinary circuitry. Similarly, audio, like AC, is also a wave which is better represented by Trits and trinary circuitry rather than binary. Both binary systems and trinary systems store their variables in capacitors or semiconductor capacitance, three variables in the case of trinary and two variables in the case of binary. Effectively, by using 3 variables instead of 2 variables (binary) at each bit equivalent level, we get 50% more throughput or storage. As explained, Registers are abstracted to make RAM, the ALU and Control Unit along with RAM and memory make a basic GPU. Trinary uses 1 Trit to represent the three stages of 0, 1, 2 as RGB, unlike binary which is more suited for black and white (1,0) and needs to use 2 bits to represent RGB e.g. (10,00,11). The basic building blocks of binary vs trinary are explained visually in FIG. 24.

Black and White bit logic, 1 bit ($2^1$) only 2 colours (not greyscale) image above, 2 bit ($2^2=4$ colours) Black, White and 2 shades of grey, 8 bit ($2^8=256$) is the basic colour display, trinary equivalent of this would be 8 trit ($3^8=6561$ colours). Below is a hypothetical intermediate step explained. Presently 8 bits are dedicated to each R, G, and B to make $((2^8) \times 3)$ i.e. $256 \times 256 \times 256 = 16,777,216$ colours or 16.8 Mn colours, the equivalent of trinary is $((3^8 \times 3)$ i.e. $6561 \times 6561 \times 6561 = 282,429,536,891$ or 282 Bn colours, as shown in FIG. 25. Colour in Binary computers (FIG. 25) are input binary signals (a), (b), (c) to (d), (e), (f) to get resultant output (g). In the case of a Trinary computer, the input signal starts from (d), (e), (f) to give output (g) which skips a major undesirable step of (a), (b), (c).

The trinary system can also be applied in the further making of optical computers and quantum computers.

Photons travel faster than electrons therefore optical computers using a Trinary Computer (Tx) over light waves (laser) can be built (TxO).

Present day quantum computers require freezing of atoms which is not required in the case of a Trinary Optical computer hence a Trinary Optical Quantum computer can be built (TxOQ).

The trinary system has application in display technologies using R, G, B as Trinary 0, 1, 2, instead of binary, and may use 3 axis x, y, z in capturing of video for depth and spatial distance for new display devices.

The trinary computer can be applied to Light Emitting Triodes (LET) instead of Light Emitting Diodes (LED) to create new display units.

The trinary system has application in peripherals such as printer technologies which work on Cyan, Magenta and Yellow. Through use of Trinary circuitry and logic, the lag time in printing may reduce, and the differences that arise in printing vs display technologies may also reduce.

The trinary system may have application of transmission of GSM signal, wifi, fibre optic cable, audio files, speech, sound and audio visual files. Present technology uses a pulsating method to transmit binary data over these spectrum wavelengths, whereas our Trinary computing method may increase data throughput at each bit equivalent level by more than 50% by use of Trits, and may also reduce the pulsating gaps that are required.

The primary objective of the initial design and simulation is to validate the science of a Trinary computer and that Alternating Current and multiple variable computing is possible, which in turn can become the building blocks to making a computer chip, memory, storage and finally a computer.

For the purpose of the validation of the science, existing silicon MOSFETs have been used for validation. The actual implementation of a trinary chip in semiconductor lithography and the phosphorous (P) and boron (N) doping (P-N junctions) will vary significantly for performance and efficiency.

At the very fundamental level, electronics have only 2 functions, switching or amplification. Traditionally, binary is defined as Digital and non-binary as Analogue. Typically, digital is used for switching i.e. binary, and analogue for amplification i.e. non-binary.

The inverter provides the switching ability to an electronic component also called the NOT gate.

To prove non-binary (Trinary) switching, Alternate Current is relied. In this concept validation, silicon MOSFETs may be used in the design to prove that trinary computing is possible using Alternate Current and to act as a multi variable switch, which can create the basic building blocks of computing. These building blocks can lead to Very/Ultra Large Scale trinary Integrated circuits (VLSI/ULSI) semiconductor design.

Trinary functions may be designed using the silicon MOSFET transistors to prove that Trinary computing is possible using Alternating Current.

Figure 26:
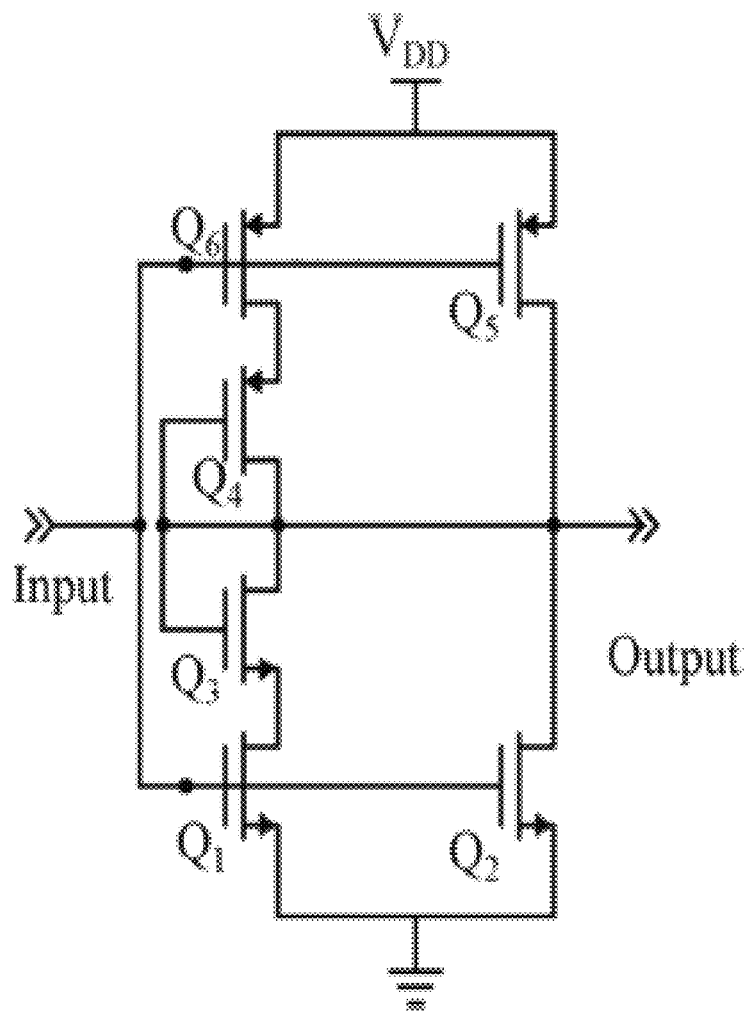
FIG. 26 shows a circuit schematic of a trinary NOT gate (inverter).

FIG. 26 shows a circuit of a trinary NOT gate or inverter. In the circuit shown in FIG. 26, 'Vth=threshold AC voltage'; Q1 (Vth=0.24 Volt), Q2 (Vth=0.6 Volt), Q3 (Vth=0.4 Volt) are NMOS transistors; and Q4 (Vth=−0.4 Volt), Q5 (Vth=−0.6), Q6 (Vth=−0.24) are PMOS transistors. Table 1 is an input-output table for a trinary inverter.

TABLE 1

Input-Output Table for Trinary Inverter

| Input (AC) | Output (AC) | Status |
|---|---|---|
| 0 (0 volt) | 2 (0.9 Volt) | Inversion (True to False) |
| 2 (0.9 Volt) | 0 (0 volt) | Inversion (False to True) |
| 1 (0.45 Volt) | 1 (0.45 Volt) | (Neutral-Neutral) |

The circuit configuration in FIG. 26 uses MOSFETs with Alternating Current, which can utilize non binary inputs (e.g., Trinary) that are inverted to achieve a Trinary Inverter.

Figure 27:
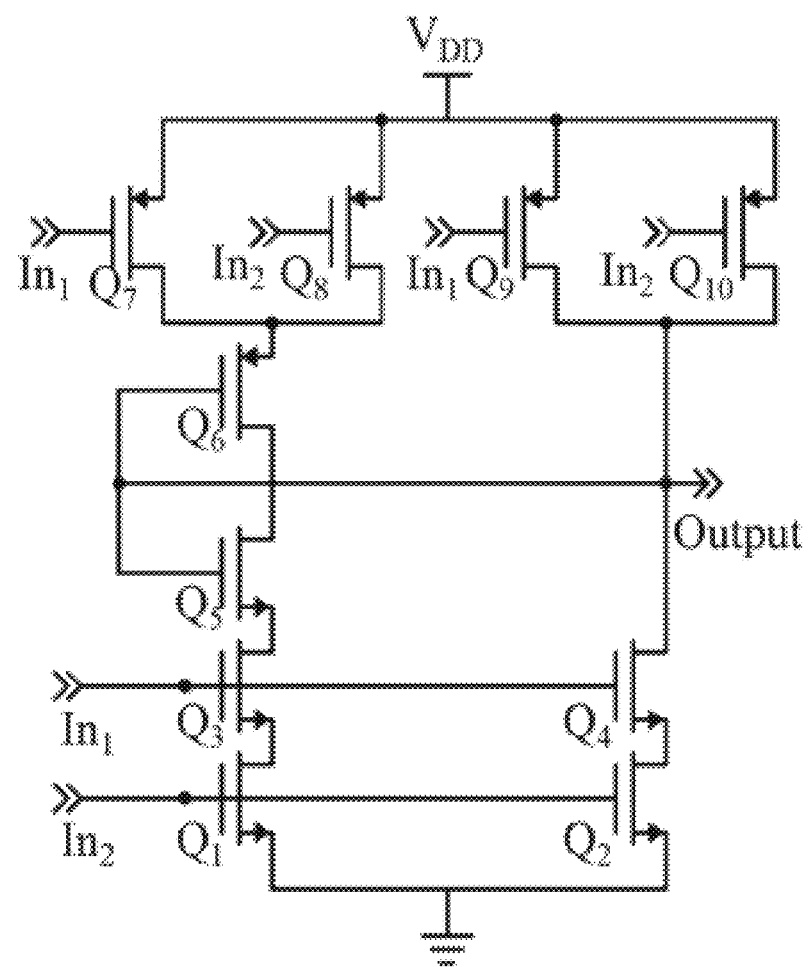
FIG. 27 shows a circuit schematic of a trinary NAND gate.

FIG. 27 shows a circuit of a trinary NAND gate. In the circuit shown in FIG. 27, transistors Q1, Q2, Q3, Q4, Q5 are NMOS transistors with threshold voltages of 0.24, 0.6, 0.24, 0.6, 0.4 AC Volt, respectively, and transistors Q6, Q7, Q8, Q9, Q10 are PMOS transistors with threshold voltages −0.4, −0.24, −0.24, −0.6, −0.6 AC Volt respectively. Table 2 is an input-output table for a trinary NAND gate.

TABLE 2

Input-Output Table for Trinary NAND gate

| Input 1 (AC) | Input 2 (AC) | Output (AC) | Status |
|---|---|---|---|
| 1 (0.45 Volts) | 2 (0.9 Volt) | 1 (0.45 Volt) | NAND operation |
| 0 (0 volt) | 0 (0 volt) | 2 (0.9 Volt) | NAND operation |
| 0 (0 volt) | 2 (0.9 Volt) | 2 (0.9 Volt) | NAND operation |

The circuit configuration in FIG. 27 uses MOSFETs with Alternating Current and non binary inputs to achieve functionality as a Trinary NAND gate. A NAND gate is a very crucial component of a computer, and an entire computer can be built on NAND gates.

Figure 28:
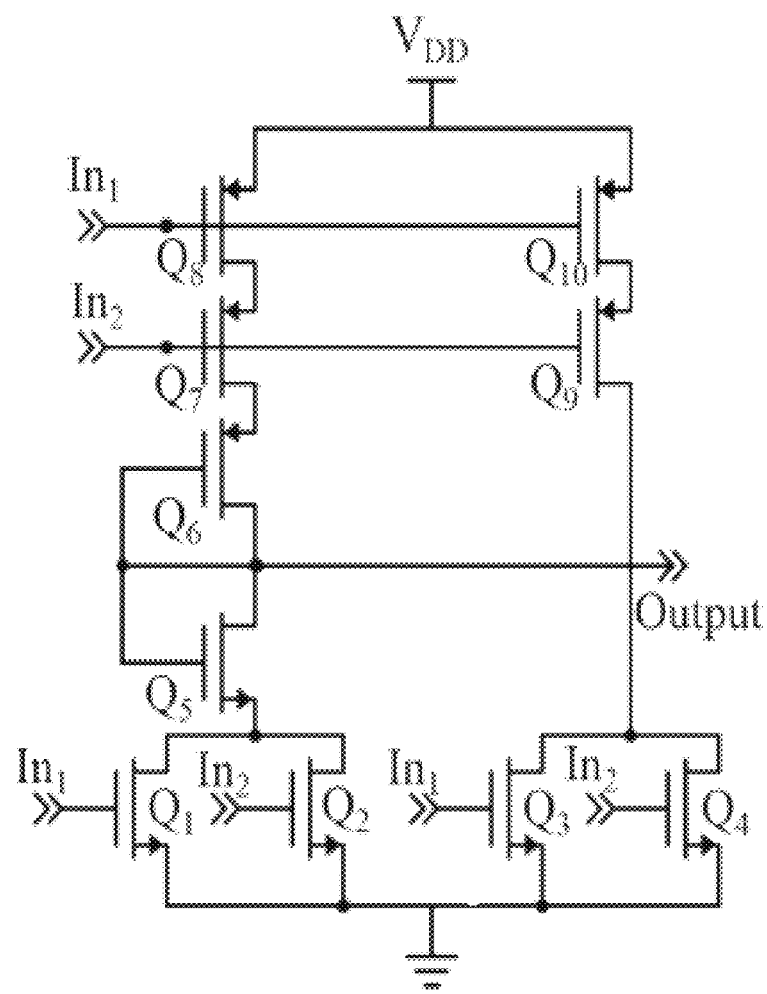
FIG. 28 shows a circuit schematic of a trinary NOR gate.

FIG. 28 shows a circuit of a trinary NOR gate. In the circuit shown in FIG. 28, transistors Q1,Q2,Q3,Q4,Q5 are NMOS transistors with threshold voltages of 0.24, 0.24, 0.6, 0.6, 0.4 AC Volt respectively, and transistors Q6, Q7, Q8, Q9, Q10 are PMOS transistors with threshold voltages −0.4, −0.24, −0.24, −0.6, −0.6 AC Volt respectively. Table 3 is an input-output table for a trinary NOR gate.

TABLE 3

Input-Output Table for Trinary NOR gate

| Input 1 (AC) | Input 2 (AC) | Output (AC) | Status |
|---|---|---|---|
| 0 (0 volt) | 0 (0 volt) | 2 (0.9 Volt) | NOR operation |
| 0 (0 volt) | 1 (0.45 Volt) | 2 (0.9 Volt) | NOR operation |
| 0 (0 volt) | 2 (0.9 Volt) | 2 (0.9 Volt) | NOR operation |

The circuit configuration in FIG. 28 uses MOSFETs with Alternating Current and non binary inputs to achieve functionality as a Trinary NOR gate.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

The invention claimed is:

1. An integrated circuit for a computer, the integrated circuit comprising:
 a non-binary logic gate circuit configured to perform a logic operation, the non-binary logic gate circuit comprising:
  at least one input terminal;
  an output terminal; and
  transistor circuitry configured to:
   receive, via the at least one input terminal, at least one alternating current (AC) input voltage at three input voltage levels, wherein each of the three input voltage levels corresponds to a respective one of three logic values; and
   generate, at the output terminal, an output voltage at one or more output voltage levels based on the at least one AC input voltage and the logic operation, wherein each of the one or more output voltage levels corresponds to a respective one of the three logic values.

2. The integrated circuit of claim 1, wherein the non-binary logic gate circuit comprises a non-binary NOT gate circuit, and wherein the transistor circuitry, in order to generate the output voltage, is configured to:
 generate the output voltage at a first output voltage level corresponding to a TRUE logic value in response to the at least one AC input voltage at a second input voltage level corresponding to a FALSE logic value;
 generate the output voltage at a second output voltage level corresponding to the FALSE logic value in response to the at least one AC input voltage at a first input voltage level corresponding to the TRUE logic value; and
 generate the output voltage at a third output voltage level corresponding to a NEUTRAL logic value in response to the at least one AC input voltage at a third input voltage level corresponding to the NEUTRAL logic value.

3. The integrated circuit of claim 2, wherein the transistor circuitry comprises:
   a plurality of PMOS transistors having different threshold voltages from each other; and
   a plurality of NMOS transistors having different threshold voltages from each other.

4. The integrated circuit of claim 1, wherein the non-binary logic gate circuit comprises a non-binary NAND gate circuit, the at least one AC input voltage comprises a first AC input voltage and a second AC input voltage, and wherein the transistor circuitry, in order to generate the output voltage, is configured to:
   generate the output voltage at a second output voltage level corresponding to a NEUTRAL logic value in response to the first AC input voltage at a third input voltage level corresponding to the NEUTRAL logic value and a second AC input voltage at a first input voltage level corresponding to a TRUE logic value;
   generate the output voltage at a first output voltage level corresponding to the TRUE logic value in response to the first AC input voltage at a second input voltage level corresponding to a FALSE logic value and the second AC input voltage at the second input voltage level corresponding to the FALSE logic value; and
   generate the output voltage at the first output voltage level corresponding to the TRUE logic value in response to the first AC input voltage at the second input voltage level corresponding to the FALSE logic value and the second AC input voltage at the first input voltage level corresponding to the TRUE logic value.

5. The integrated circuit of claim 4, wherein the transistor circuit comprises:
   a plurality of PMOS transistors having three different threshold voltages; and
   a plurality of NMOS transistors having three different threshold voltages.

6. The integrated circuit of claim 1, wherein the non-binary logic gate circuit comprises a non-binary NOR gate circuit, the at least one AC input voltage comprises a first AC input voltage and a second AC input voltage, and wherein the transistor circuitry, in order to generate the output voltage, is configured to:
   generate the output voltage at an output voltage level corresponding to a TRUE logic value in response to the first AC input voltage at a second input voltage level corresponding to a FALSE logic value and the second AC input voltage at the second input voltage level corresponding to the FALSE logic value;
   generate the output voltage at the output voltage level corresponding to the TRUE logic value in response to the first AC input voltage at the second input voltage level corresponding to the FALSE logic value and the second AC input voltage at a third input voltage level corresponding to a NEUTRAL logic value; and
   generate the output voltage at the output voltage level corresponding to the TRUE logic value in response to the first AC input voltage at the second input voltage level corresponding to the FALSE logic value and the second AC input voltage at a first input voltage level corresponding to the TRUE logic value.

7. The integrated circuit of claim 6, wherein the transistor circuitry comprises:
   a plurality of PMOS transistors having three different threshold voltages; and
   a plurality of NMOS transistors having three different threshold voltages.

* * * * *